US012562114B2

(12) United States Patent
Kim

(10) Patent No.: US 12,562,114 B2
(45) Date of Patent: Feb. 24, 2026

(54) DISPLAY DEVICE

(71) Applicant: LG Display Co., Ltd., Seoul (KR)

(72) Inventor: YuHoon Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/767,033

(22) Filed: Jul. 9, 2024

(65) Prior Publication Data

US 2025/0246138 A1 Jul. 31, 2025

(30) Foreign Application Priority Data

Jan. 29, 2024 (KR) ........................ 10-2024-0012903

(51) Int. Cl.
*G09G 3/20* (2006.01)
*G09G 3/3233* (2016.01)
*H10K 59/80* (2023.01)

(52) U.S. Cl.
CPC ......... *G09G 3/3233* (2013.01); *G09G 3/2085* (2013.01); *H10K 59/879* (2023.02); *G09G 2300/0814* (2013.01); *G09G 2300/0842* (2013.01); *G09G 2310/08* (2013.01); *G09G 2320/0285* (2013.01); *G09G 2320/043* (2013.01); *G09G 2320/048* (2013.01); *G09G 2320/068* (2013.01); *G09G 2320/08* (2013.01); *G09G 2380/10* (2013.01)

(58) Field of Classification Search
CPC .... H10K 59/879; H10K 59/352; H10K 59/19; H10K 59/8792; H10K 50/865; G09G 2320/043; G09G 2320/048; G09G 2320/068; G09G 3/3233; G09G 2320/028; G09G 2380/10; G09G 3/003; G09G 2320/045; G09G 2320/06; G09G 2320/08; G09G 2310/08; G02F 1/1323; G02F 1/133753; G02F 1/134381; G02F 1/133626; G02B 27/0172; G02B 27/0101
See application file for complete search history.

(56) References Cited

U.S. PATENT DOCUMENTS 10,663,776 B1 * 5/2020 Hopkin ................ G02B 6/0031
12,175,928 B2 * 12/2024 Wu ........................ H10K 59/80
(Continued)

FOREIGN PATENT DOCUMENTS

KR 10-2022-0043779 A 4/2022

*Primary Examiner* — Dismery Mercedes
(74) *Attorney, Agent, or Firm* — Morgan, Lewis & Bockius LLP

(57) ABSTRACT

A display device may include a display panel having a first area, a second area adjacent to the first area in a first direction, and a third area adjacent to the second area in the first direction, and including first light emitting diodes, second light emitting diodes, first optical members, and second optical members. The display device may further include a mode controller configured to generate a mode selection signal corresponding to a driving mode of the display panel, and a mode selector configured to generate a selection signal based on the mode selection signal, and to supply the selection signal to the display panel. The first and second light emitting diodes and the first optical members may be disposed in each of the first, second, and third areas. The second optical members may be disposed in each of the second and third areas.

19 Claims, 21 Drawing Sheets

100

(56) References Cited

U.S. PATENT DOCUMENTS

| | | | | |
|---|---|---|---|---|
| 2011/0234605 A1* | 9/2011 | Smith | .................... | G09G 3/003 |
| | | | | 359/462 |
| 2017/0219859 A1* | 8/2017 | Christophy | ............... | G02F 1/29 |
| 2021/0090487 A1* | 3/2021 | Chu | .................... | H01L 25/0753 |
| 2022/0158134 A1* | 5/2022 | Hinata | ................. | G02B 3/0043 |
| 2022/0358875 A1* | 11/2022 | Won | ........................ | G09G 3/32 |
| 2023/0014363 A1* | 1/2023 | Ikeda | ................. | H01L 25/0753 |
| 2023/0117873 A1* | 4/2023 | Kim | ........................ | G09G 3/32 |
| | | | | 345/55 |
| 2023/0124835 A1* | 4/2023 | Kikuchi | ............... | H10K 59/351 |
| | | | | 345/694 |
| 2023/0186833 A1* | 6/2023 | Kim | ........................ | G09G 3/32 |
| | | | | 345/690 |
| 2023/0298502 A1* | 9/2023 | Lee | ...................... | G09G 3/3233 |
| 2024/0402543 A1* | 12/2024 | Sánchez Castillo | ........................ | |
| | | | | G02F 1/134309 |

* cited by examiner

100

DISPLAY DEVICE

CROSS-REFERENCE TO RELATED APPLICATIONS

This application claims the priority of Korean Patent Application No. KR 10-2024-0012903 filed on Jan. 29, 2024, the entire disclosure of which is incorporated herein by reference for all purposes.

BACKGROUND

1. Technical Field

The present disclosure relates to a display device, and more particularly to, for example, without limitation, a display device whose viewing angle can be controlled.

2. Description of the Related Art

With the advancement of technologies in the modern society, a display device has been used in various forms to supply users with information. The display device is also included in various electronic devices, which receive a user input and use advanced technologies to supply information in response to the received input, as well as an electronic display board that unilaterally transfers visual information.

For example, the display device may be included in a vehicle to supply various kinds of information to a driver and a passenger of the vehicle. However, the display device of the vehicle needs to properly display content so as not to disturb driving of the vehicle. For example, the display device needs to limit a display of content which can potentially disturb the driver's concentration on driving during the driving of the vehicle.

The description of the related art should not be assumed to be prior art merely because it is mentioned in or associated with this section. The description of the related art includes information that describes one or more aspects of the subject technology, and the description in this section does not limit the invention.

SUMMARY

In one or more aspects, an object to be achieved by the present disclosure is to provide a display device in which a plurality of light emitting diodes can be separately driven depending on a driving mode.

In one or more aspects, another object to be achieved by the present disclosure is to provide a display device in which a plurality of areas can be driven in synchronization with each other regardless of a driving mode.

Objects of the present disclosure are not limited to the above-mentioned objects, and other objects, which are not mentioned above, can be clearly understood by those skilled in the art from the following descriptions.

According to one or more examples embodiments of the present disclosure, there is provided a display device. The display device comprises: a display panel divided into a first area, a second area adjacent to the first area in a first direction, and a third area adjacent to the second area in the first direction, and including a plurality of first light emitting diodes, a plurality of second light emitting diodes, a plurality of first optical members, and a plurality of second optical members; a mode controller configured to generate a mode selection signal corresponding to a driving mode of the display panel; and a mode selector configured to generate a selection signal based on the mode selection signal, and to supply the selection signal to the display panel, wherein the plurality of first light emitting diodes, the plurality of second light emitting diodes, and the plurality of first optical members are disposed in each of the first area, the second area, and the third area, and the plurality of second optical members is disposed in each of the second area and the third area, and at least some of the plurality of first optical members in the first area are disposed in a same row as the plurality of second optical members in the second area and the third area.

According to an example embodiment of the present disclosure, a plurality of light emitting diodes can be separately driven depending on a driving mode. Thus, it is possible to improve the luminous efficiency and lifespan of light emitting diodes.

Other detailed matters of the example embodiments are included in the detailed description and the drawings.

Objects of the example embodiment of the present disclosure are not limited to the above-mentioned objects, and other objects, which are not mentioned above, can be clearly understood by those skilled in the art from the following descriptions.

According to an example embodiment of the present disclosure, a plurality of areas can be driven in synchronization with each other regardless of a driving mode. Thus, it is possible to simplify the operation and structure of a display panel.

The effects according to the present disclosure are not limited to the contents exemplified above, and more various effects are included in the present specification.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure. In the drawings.

Figure 1:
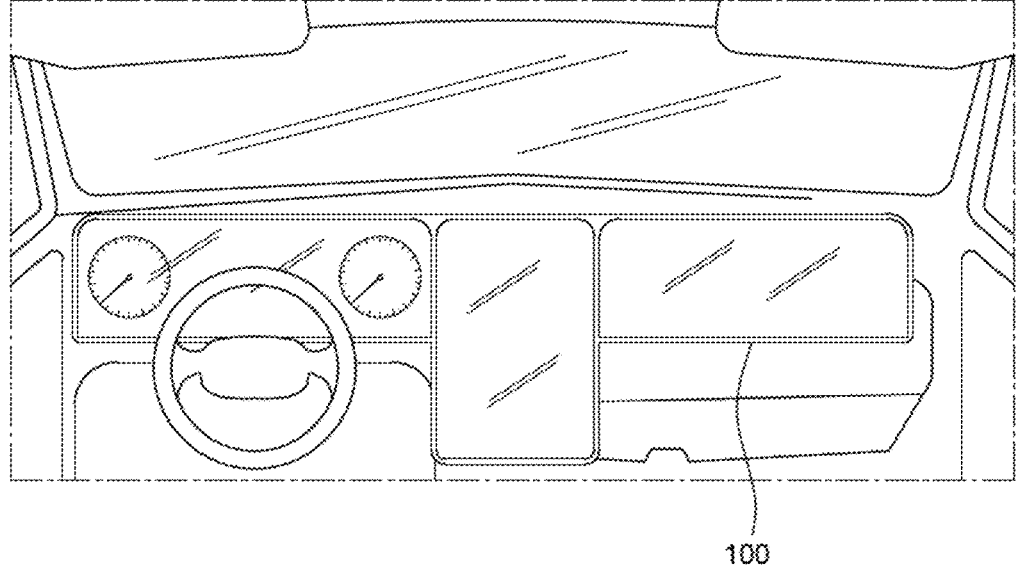
FIG. 1 illustrates an example of a display device according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," "comprising" and the like used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be disposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

FIG. 1 illustrates an example of a display device according to an example embodiment of the present disclosure.

Referring to FIG. 1, a display device 100 may be disposed on at least a portion of a dashboard of a vehicle. The dashboard of the vehicle may include components disposed on a front surface of a front seat (e.g., driver seat, passenger seat) in the vehicle. For example, input components for manipulating various functions (e.g., air conditioner, audio system, navigation system) inside the vehicle may be disposed on the dashboard of the vehicle.

The display device 100 may be disposed on the dashboard of the vehicle and may operate as an input device for manipulating at least some of the various functions of the vehicle. The display device 100 may supply various kinds of information related to the vehicle, for example, driving information of the vehicle (e.g., present speed, residual fuel quantity, mileage), and information related to components of the vehicle (e.g., damage degree of a vehicle tire).

The display device 100 may be disposed to extend across the driver seat and the front passenger seat, which are front seats in the vehicle. A user of the display device 100 may include a driver of the vehicle and a passenger on the front passenger seat in the vehicle. Both of the driver and the passenger may use the display device 100.

FIG. 1 may show a portion of the display device 100. FIG. 1 may show a display panel among various components of the display device 100. Specifically, for example, the display device 100 shown in FIG. 1 may represent at least a portion of a display area and a non-display area of the display panel. The other components of the display device 100 may be mounted in the interior (or at least a portion) of the vehicle.

Figure 2:
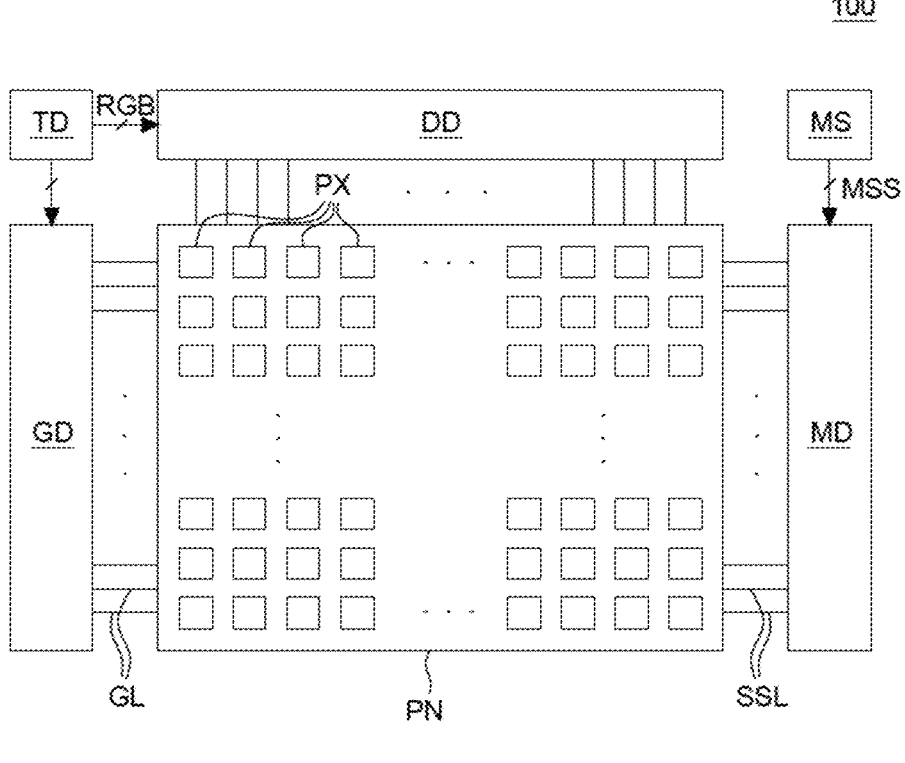
FIG. 2 is a functional block view illustrating the display device according to an example embodiment of the present disclosure.
Figure 3:
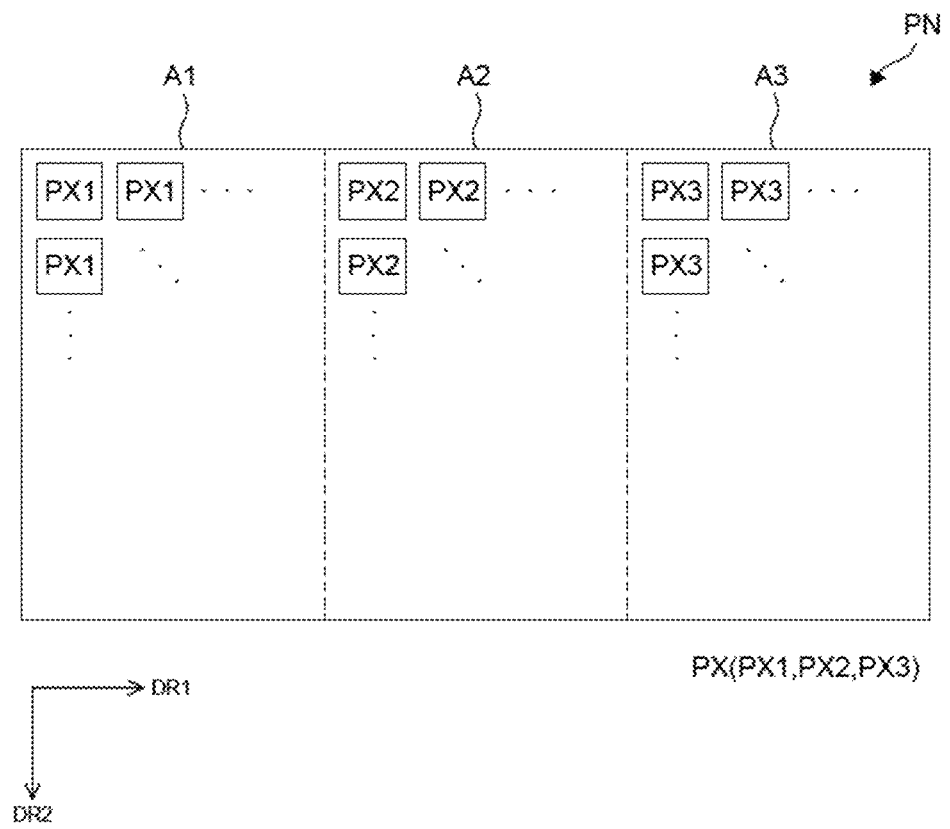
FIG. 3 illustrates an example of a display panel included in the display device of FIG. 2.

FIG. 2 is a functional block view illustrating the display device according to an example embodiment of the present disclosure. FIG. 3 illustrates an example of a display panel included in the display device of FIG. 2.

FIG. 3 illustrates a horizontal direction as a first direction DR1 and a vertical direction as a second direction DR2 for the convenience of description.

An electroluminescent display device may be applied to the display device according to an example embodiment of the present disclosure. The electroluminescent display device may be an organic light emitting diode display device, a quantum-dot light emitting diode display device, or an inorganic light emitting diode display device.

Referring to FIG. 2, the display device 100 may include a display panel PN, a data driver DD, a gate driver GD, and a timing controller TD. The display device 100 may further include a mode controller MS and a mode selector MD.

The display panel PN may generate an image to be supplied to the user. For example, the display panel PN may generate and display an image to be supplied to the user through a plurality of pixels PX including a plurality of pixel circuits, respectively.

The data driver DD, the gate driver GD, and the timing controller TD may supply a signal for operating pixels PX through signal lines, respectively. For example, the signal lines for supplying a signal for operating pixels PX may include a plurality of data lines DL and a plurality of gate lines GL.

The mode controller MS may supply a signal for controlling a driving mode of pixels PX through the signal lines, respectively. For example, the signal lines for supplying a signal for controlling a driving mode of pixels PX may include a plurality of selection signal lines SSL.

The plurality of data lines DL may be disposed in a column direction, and may include a plurality of lines connected to pixels PX disposed in one column direction. Also, the plurality of gate lines GL is disposed in a row direction, and may include a plurality of lines connected to pixels PX disposed in one row direction.

Also, the plurality of selection signal lines SSL is disposed in the row direction, and may include a plurality of lines connected to pixels PX disposed in one row direction. Each of the plurality of selection signal lines SSL may include a first selection signal line SSL1 and a second selection signal line SSL2. The first selection signal line SSL1 and the second selection signal line SSL2 included in each of the plurality of selection signal lines SSL are disposed adjacent to each other along the column direction, and may extend in the row direction in one row. For example, one row may include two sub-rows, and the first selection signal line SSL1 and the second selection signal line SSL2 may be disposed in the respective sub-rows in the row direction.

The first selection signal line SSL1 and the second selection signal line SSL2 may be commonly connected to each of the plurality of pixels PX disposed in one row. In other words, the first selection signal line SSL1 and the second selection signal line SSL2 may be commonly connected to one pixel PX.

In some embodiments, the display device 100 may further include a power supplier. In this case, a signal for operating each pixel PX may be supplied through a power line connecting the power supplier to the display panel PN. In some embodiments, the power supplier may supply power to the data driver DD and the gate driver GD. The data driver DD and the gate driver GD may be driven based on the power supplied from the power supplier.

For example, the data driver DD may apply a data signal to pixels PX through the plurality of data lines DL, respectively, and the gate driver GD may apply a gate signal to pixels PX through the plurality of gate lines GL, respectively. Also, the power supplier may supply a power voltage to pixels PX through power voltage supply lines, respectively.

The timing controller TD may control the data driver DD and the gate driver GD. For example, the timing controller TD may realign digital video data input from the outside in accordance with the resolution of the display panel PN and may supply the realigned digital video data to the data driver DD.

The data driver DD may convert the digital video data input from the timing controller TD into an analog data voltage based on a data control signal and may supply the analog data voltage to the plurality of data lines DL.

The gate driver GD may generate a scan signal and an emission signal (or emission control signal) based on a gate control signal. For example, the gate driver GD may include a scan driver and an emission signal driver. The scan driver may generate scan signals in a row sequential manner to drive at least one scan line connected to each pixel row and may supply the scan signals to the scan lines. The emission signal driver may generate emission signals in a row sequential manner to drive at least one emission signal line connected to each pixel row and may supply the emission signals to the emission signal lines.

In some embodiments, the gate driver GD may be disposed on the display panel DP in a Gate-driver In Panel (GIP) method. For example, the gate driver GD may be divided into a plurality of gate drivers GD and then disposed on at least two lateral surfaces of the display panel PN, respectively.

The mode controller MS may control the mode selector MD. For example, the mode controller MS may generate a mode selection signal MSS for controlling the mode selector MD based on a mode signal input depending on a driving mode of the display device 100 and may supply the mode selection signal MSS to the mode selector MD. In some embodiments, the mode selection controller MS may supply the mode selector MD with the mode selection signal MSS for controlling the mode selector MD in response to a power signal of the display device 100.

Details of the mode controller MS and the mode selector MD controlled by the mode controller MS will be described below with reference to FIG. 9A through FIG. 17.

The display panel PN may include a display area and a non-display area enclosing the display area.

The display area of the display panel PN may include a plurality of pixels PX disposed in the row direction and the column direction. The plurality of pixels PX may be disposed at intersections between the plurality of data lines DL and the plurality of gate lines GL.

Each pixel PX may include a plurality of sub-pixels which emits light of different colors. For example, each pixel PX may implement blue, red, and green colors by using three sub-pixels, but is not limited thereto. In some embodiments, the pixel PX may further include a sub-pixel for implementing a specific color (e.g., white).

In the pixel PX, a region implementing blue may be referred to as a blue sub-pixel, a region implementing red may be referred to as a red sub-pixel, and a region implementing green may be referred to as a green sub-pixel.

Each of the plurality of pixels PX may include a first light emitting diode and a second light emitting diode which emit light of the same color.

Each of the plurality of pixels PX may include at least one of a first lens and a second lens which refract light from the first light emitting diode and the second light emitting diode in a specific direction. Meanwhile, the term "lens" is used herein for the convenience of description and may also be defined as "optical member".

For example, the first lens may be disposed in a first lens area which supplies light to a first range to form a first viewing angle. Also, the second lens may be disposed in a second lens area which supplies light to a second range to form a second viewing angle. The first range may be wider than the second range. Thus, a viewing angle of each of the plurality of pixels PX may be limited by the first lens and the second lens.

Details of the first lens and the second lens will be described below with reference to FIG. 7 and FIG. 8.

The non-display area may be disposed along the circumference of the display area.

Various components for driving the pixel circuit disposed in the pixel PX may be disposed in the non-display area. For example, at least a part of the gate driver GD may be disposed in the non-display area. The non-display area may be referred to as a bezel area.

The display panel PN may be divided into a plurality of areas. In other words, the display panel PN may include a plurality of areas.

For example, referring to FIG. 3, the display panel PN may be divided into three areas A1, A2 and A3. That is, the display panel PN may include a first area A1, a second area A2 adjacent to the first area A1 in the first direction DR1, and a third area A3 adjacent to the second area A2 in the first direction DR1. For example, the second area A2 may be located between the first area A1 and the third area A3.

Each of the areas A1, A2 and A3 included in the display panel PN may include a plurality of pixels PX including a plurality of pixel circuits, respectively. For example, a plurality of first pixels PX1 may be disposed to be spaced apart from each other in the first direction DR1 and the second direction DR2 in the first area A1 of the display panel PN. Also, a plurality of second pixels PX2 may be disposed to be spaced apart from each other in the first direction DR1 and the second direction DR2 in the second area A2 of the display panel PN. Further, a plurality of third pixels PX3 may be disposed to be spaced apart from each other in the second direction DR2 in the third area A3 of the display panel PN.

Each of the plurality of first pixels PX1, the plurality of second pixels PX2, and the plurality of third pixels PX3 included in the plurality of areas A1, A2 and A3, respectively, may include the same pixel circuit.

For example, each of the plurality of first pixels PX1, the plurality of second pixels PX2, and the plurality of third pixels PX3 included in the plurality of areas A1, A2 and A3, respectively, may include a driver circuit, a selection circuit, and the first and second light emitting diodes which emit light of the same color.

Herein, the driver circuit may serve to supply a driving current to the first light emitting diode and the second light emitting diode based on signals supplied form the data driver DD and the gate driver GD.

Also, the selection circuit may serve to control the generation of one of a first driving current flowing through the first light emitting diode and a second driving current flowing through the second light emitting diode based on a selection signal supplied from the mode selector MD. In other words, the selection circuit may control the formation of a current path of the first driving current to allow the first light emitting diode to emit light. Alternatively, the selection circuit may control the formation of a current path of the second driving current to allow the second light emitting diode to emit light. For example, when a first selection signal is supplied to the selection circuit from the mode selector MD through the first selection signal line SSL1, a first driving current may be generated. Thus, the first light emitting diode may emit light. Also, when a second selection signal is supplied to the selection circuit from the mode selector MD through the second selection signal line SSL2, a second driving current may be generated. Thus, the second light emitting diode may emit light. However, the present disclosure is not limited thereto. The selection circuit may be included in the driver circuit.

Hereinafter, for the convenience of description, a pixel PX being driven in a first state is defined by when a current path of a first driving current is formed and the first light emitting diode emits light. Also, a pixel PX being driven in a second state is defined by when a current path of a second driving current is formed and the second light emitting diode emits light.

Each of the plurality of first pixels PX1 disposed in the first area A1 may include two first lenses configured to respectively refract light emitted from the first light emitting diode and light emitted from the second light emitting diode in a specific direction. For example, light emitted from the first light emitting diode and light emitted from the second light emitting diode included in each of the plurality of first pixels PX1 disposed in the first area A1 may be refracted in a specific direction by the first lenses, respectively.

Herein, the selection circuit may control each of the plurality of first pixels PX1 disposed in the first area A1 to be driven in the first state and a current path of the first driving current may be formed in each of the plurality of first pixels PX1. In this case, light may be generated from the first light emitting diode included in each of the plurality of first pixels PX1 and refracted in a specific direction by the first lens. Also, the selection circuit may control each of the plurality of first pixels PX1 disposed in the first area A1 to be driven in the second state and a current path of the second driving current may be formed in each of the plurality of second pixels PX2. In this case, light may be generated from the second light emitting diode included in each of the plurality of first pixels PX1 and refracted in a specific direction by the first lens.

Each of the plurality of second pixels PX2 and the plurality of third pixels PX3 disposed in the second area A2 and the third area A3 may include a first lens configured to refract light emitted from the first light emitting diode in a specific direction. Also, each of the plurality of second pixels PX2 and the plurality of third pixels PX3 disposed in the second area A2 and the third area A3 may include a second lens configured to refract light emitted from the second light emitting diode in a specific direction.

For example, light emitted from the first light emitting diode included in each of the plurality of second pixels PX2 disposed in the second area A2 may be refracted in a specific direction by the first lens. Also, light emitted from the second light emitting diode included in each of the plurality of second pixels PX2 disposed in the second area A2 may be refracted in a specific direction by the second lens.

Herein, the selection circuit may control each of the plurality of second pixels PX2 disposed in the second area A2 to be driven in the first state and a current path of the first driving current may be formed in each of the plurality of second pixels PX2. In this case, light may be generated from the first light emitting diode included in each of the plurality of second pixels PX2 and refracted in a specific direction by the first lens. Also, the selection circuit may control each of the plurality of second pixels PX2 disposed in the second area A2 to be driven in the second state and a current path of the second driving current may be formed in each of the plurality of second pixels PX2. In this case, light may be generated from the second light emitting diode included in each of the plurality of second pixels PX2 and refracted in a specific direction by the second lens.

As another example, light emitted from the first light emitting diode included in each of the plurality of third pixels PX3 disposed in the third area A3 may be refracted in a specific direction by the first lens. Also, light emitted from the second light emitting diode included in each of the plurality of third pixels PX3 disposed in the third area A3 may be refracted in a specific direction by the second lens.

Herein, the selection circuit may control each of the plurality of third pixels PX3 disposed in the third area A3 to be driven in the first state and a current path of the first driving current may be formed in each of the plurality of third pixels PX3. In this case, light may be generated from the first light emitting diode included in each of the plurality of third pixels PX3 and refracted in a specific direction by the first lens. Also, the selection circuit may control each of the plurality of third pixels PX3 disposed in the third area A3 to be driven in the second state and a current path of the second driving current may be formed in each of the plurality of third pixels PX3. In this case, light may be generated from the second light emitting diode included in each of the plurality of third pixels PX3 and refracted in a specific direction by the second lens.

In some embodiments, each of the plurality of areas A1, A2 and A3 of the display panel PN may be disposed to extend across the driver seat and the front passenger seat, which are front seats in the vehicle, as described above with reference to FIG. 1. Each of the plurality of areas A1, A2 and A3 of the display panel PN may supply various kinds of information to the driver and the passenger. For example, the first area A1 corresponds to a digital cluster and supplies information, such as driving speed, RPM, engine temperature, and fuel amount. Also, the second area A2 corresponds to a center information display (CID) and supplies various convenient functions, such as audio, video, navigation, air conditioning, and Bluetooth. Further, the third area A3 corresponds to a co-driver display (CDD) and supplies entertainment functions and seat information to the passenger on the front passenger seat. However, the definition of the areas is made for the convenience of description, and the plurality of areas A1, A2 and A3 of the display panel PN may be defined variously depending on the design.

Meanwhile, when the display panel PN is used for the vehicle described above with reference to FIG. 1, at least some of the plurality of areas A1, A2 and A3 included in the display panel PN need to be limited in viewing angle according to the user's demand. For example, an image displayed in the third area A3 which supplies entertainment functions and seat information to the passenger on the front passenger seat may disturb the driver's driving of the vehicle. Therefore, a viewing angle of the image displayed in the third area A3 may need to be limited according to the user's demand.

More specifically, referring to FIG. 1, the display device 100 may use the mode controller MS and the mode selector MD to control a viewing angle of at least some of the plurality of areas A1, A2 and A3 included in the display panel PN.

The mode controller MS may generate the mode selection signal MSS for controlling the display panel PN to be driven in a first mode or a second mode depending on a driving mode of the display device 100 and supply the mode selection signal MSS to the mode selector MD. Herein, the first mode refers to a mode in which a plurality of areas A1, A2 and A3 of the display panel PN is driven in a share mode. Also, the second mode refers to a mode in which at least some, e.g., the third area A3, of the plurality of areas A1, A2 and A3 of the display panel PN is driven in a private mode.

The configuration of the mode controller MS to control the display panel PN to be driven in the first mode or the second mode depending on a driving mode of the display device 100 will be described in detail with reference to FIG. 9A through FIG. 11B.

The mode controller MS may compare the remaining lifespans of the first light emitting diode and the second light emitting diode included in the plurality of pixels PX disposed in at least some, e.g., the first area A1, of the plurality of areas A1, A2 and A3 of the display panel PN in response to a power-on signal. Then, the mode controller MS may generate the mode selection signal MSS for controlling only the first light emitting diode or the second light emitting diode to emit light during an emission period depending on the comparison result and supply the mode selection signal MSS to the mode selector MD.

The configuration of the mode controller MS to control the display panel PN in response to a power-on signal will be described in detail with reference to FIG. 12 through FIG. 17.

Figure 4:
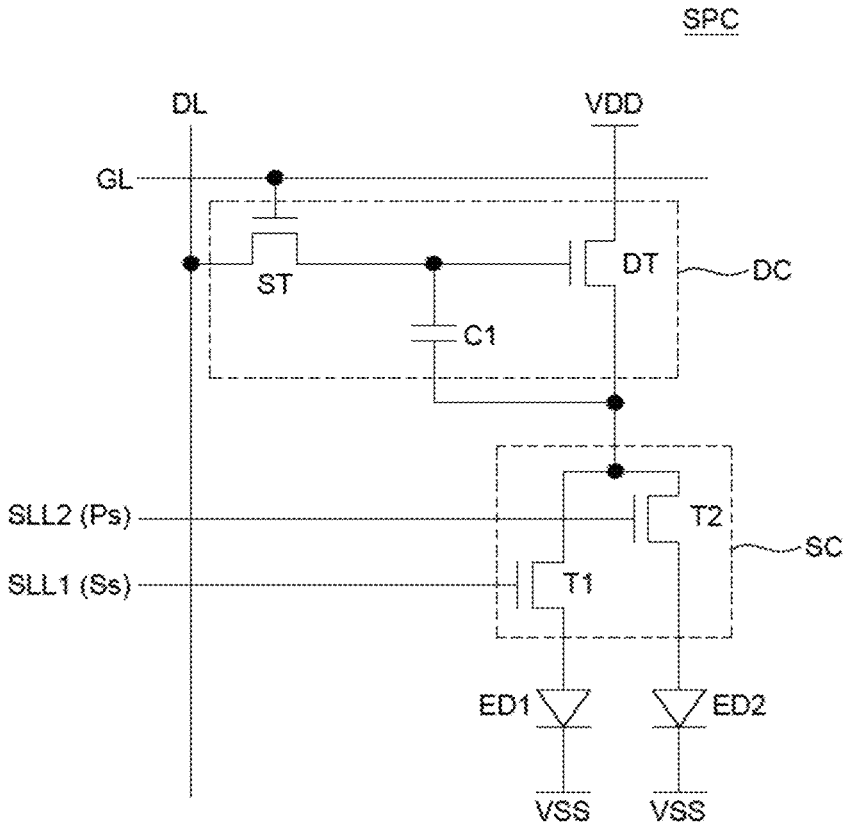
FIG. 4 is a circuit diagram illustrating an example of a pixel circuit of the display device according to an example embodiment of the present disclosure.

FIG. 4 is a circuit diagram illustrating an example of a pixel circuit of the display device according to an example embodiment of the present disclosure.

Meanwhile, FIG. 4 illustrates an example of a pixel circuit SPC corresponding to each of the plurality of pixels PX of the display device 100.

Referring to FIG. 4, the pixel circuit SPC may include a driver circuit DC, a selection circuit SC, and a plurality of light emitting diodes ED1 and ED2.

The driver circuit DC may include a driving transistor DT, a switching transistor ST, and a first capacitor C1.

The driving transistor DT and the first capacitor C1 may be connected to the switching transistor ST. A first electrode of the driving transistor DT may be connected to a first power line which supplies a first power voltage VDD, e.g., a high-potential power voltage.

The switching transistor ST may be connected to a gate line GL and supplied with a gate signal. The switching transistor ST may be turned on or turned off by the gate signal. A first electrode of the switching transistor ST may be connected to a data line DL. In this case, the data signal may be supplied to a gate electrode of the driving transistor DT through the switching transistor ST in response to the switching transistor ST being turned-on.

The first capacitor C1 may be disposed between the gate electrode and a second electrode of the driving transistor DT. The first capacitor C1 can maintain a signal, e.g., a data signal, applied to the gate electrode of the driving transistor DT during one frame.

The selection circuit SC may include a first transistor T1 for forming a current path of the first driving current flowing through the first light emitting diode ED1. Also, the selection circuit SC may include a second transistor T2 for forming a current path of the second driving current flowing through the second light emitting diode ED2.

The first transistor T1 may be disposed between the driver circuit DC and the first light emitting diode ED1. A gate electrode of the first transistor T1 may be connected to a first selection signal line SSL1 which supplies a first selection signal Ss. If the first selection signal Ss is supplied through the first selection signal line SSL1 when the pixel circuit SPC is driven in the first state, the first transistor T1 may be turned on. Thus, a current path of the first driving current flowing through the first light emitting diode ED1 may be formed. In this case, the first light emitting diode ED1 may emit light.

The second transistor T2 may be disposed between the driver circuit DC and the second light emitting diode ED2. A gate electrode of the second transistor T2 may be connected to a second selection signal line SLL2 which supplies a second selection signal Ps. If the second selection signal Ps is supplied through the second selection signal line SLL2 when the pixel circuit SPC is driven in the second state, the second transistor T2 may be turned on. Thus, a current path of the second driving current flowing through the second light emitting diode ED2 may be formed. In this case, the second light emitting diode ED2 may emit light.

The first light emitting diode ED1 may be connected between the first transistor T1 which is turned on or turned off by the first selection signal Ss and a second power line which supplies a second power voltage VSS, e.g., a low-potential power voltage. The second light emitting diode ED2 may be connected between the second transistor T2 which is turned on or turned off by the second selection signal Ps and the second power line which supplies second power voltage VSS, e.g., the low-potential power voltage.

In this case, the first light emitting diode ED1 or the second light emitting diode ED2 may be connected to another component of the pixel circuit SPC, e.g., the driving transistor DT of the driver circuit DC depending on a driving mode. Herein, the driving mode may be designated by the user's input or may be determined when a predetermined condition is satisfied.

For example, the driving mode may include the first mode in which the plurality of areas A1, A2 and A3 of the display panel PN described above with reference to FIG. 1 is driven in the share mode. Also, the driving mode may include the second mode in which at least some, e.g., the third area A3, of the plurality of areas A1, A2 and A3 of the display panel PN is driven in the private mode.

The plurality of transistors DT, ST, T1 and T2 of FIG. 4 may include at least one of amorphous silicon, polycrystalline silicon and an oxide semiconductor, such as IGZO. A first electrode or a second electrode of the transistor may be a source electrode or a drain electrode. For example, the first electrode may be a source electrode, and the second electrode may be a drain electrode. As another example, the first electrode may be a drain electrode, and the second electrode may be a source electrode.

Figure 5:
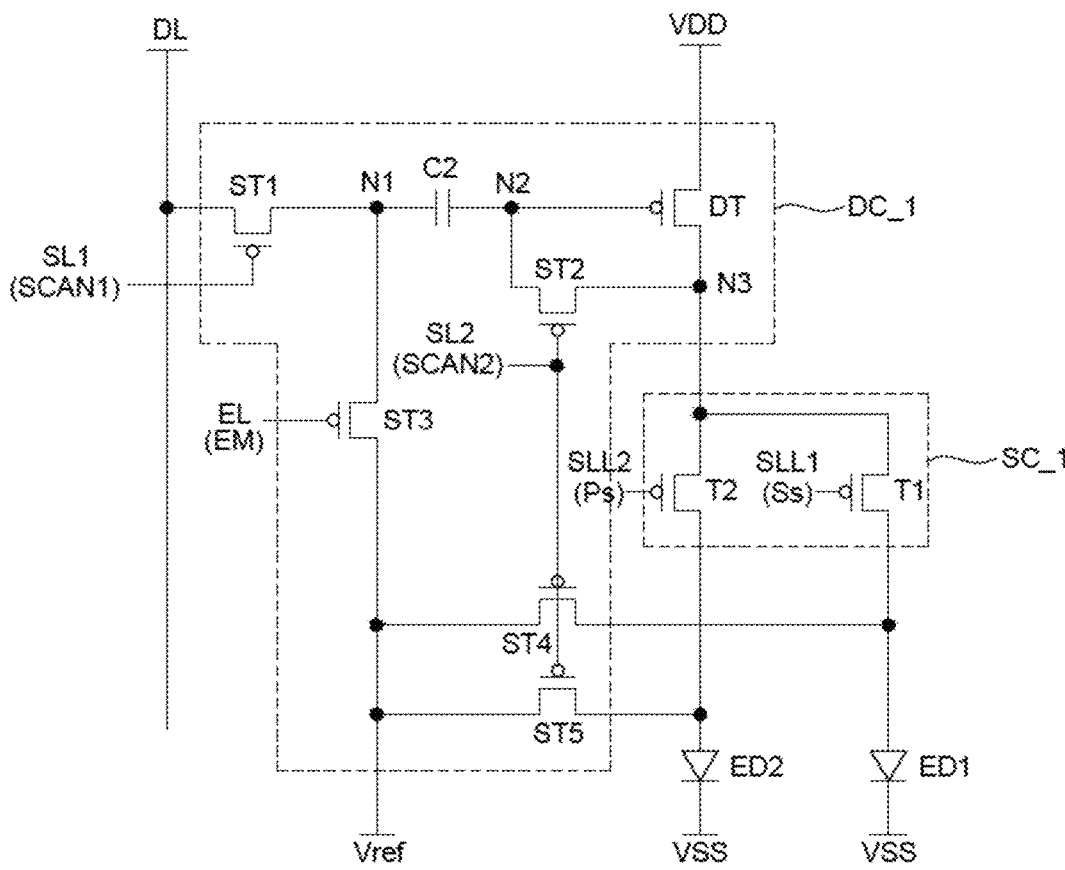
FIG. 5 is a circuit diagram illustrating another example of a pixel circuit of the display device according to an example embodiment of the present disclosure.

FIG. 5 is a circuit diagram illustrating an example of a pixel circuit of the display device according to an example embodiment of the present disclosure.

Meanwhile, FIG. 5 illustrates an example of a pixel circuit SPC_1 which can be applied to the pixel circuit SPC of FIG. 4.

Referring to FIG. 5, at least some of a plurality of transistors included in the pixel circuit SPC_1 may be n-type transistors or p-type transistors. In a p-type transistor, a low level voltage of each driving signal means a voltage for turning on the transistor, and a high level voltage of each driving signal may mean a voltage for turning off the transistor.

Herein, the low level voltage may correspond to a predetermined voltage lower than the high level voltage. For example, the low level voltage may include a voltage in the range of −8 V to −12 V. The high level voltage may correspond to a predetermined voltage higher than the low level voltage. For example, the high level voltage may include a voltage in the range of 12 V to 16 V. In some embodiments, the low level voltage may be referred to as a first voltage, and the high level voltage may be referred to as a second voltage. In this case, the first voltage may have a value lower than the second voltage.

A first electrode or a second electrode of a transistor to be described below may refer to a source electrode or a drain electrode. However, the terms, such as the first electrode and the second electrode, are used to distinguish each electrode, and do not limit what each electrode corresponds to. Further, the first electrode may not refer to the same electrode for each electrode.

The pixel circuit SPC_1 may include a driver circuit DC_1, a selection circuit SC_1, and the plurality of light emitting diodes ED1 and ED2.

The driver circuit DC_1 may include the driving transistor DT, a plurality of switching transistors ST1 to ST5, and a second capacitor C2.

The driving transistor DT may control a driving current to be applied to the plurality of light emitting diodes ED1 and ED2 according to a source-gate voltage. The driving transistor DT may include a source electrode connected to the first power line which supplies the first power voltage VDD, e.g., the high-potential power voltage, a gate electrode connected to a second node N2, and a drain electrode connected to a third node N3.

The first switching transistor ST1 may apply a data signal from the data line DL to a first node N1. The first switching transistor ST1 may include a source electrode connected to the data line DL, a drain electrode connected to the first node N1, and a gate electrode connected to a first scan signal line SL1 to which a first scan signal SCAN1 is applied. The first switching transistor ST1 may be turned on or turned off by the first scan signal SCAN1. Thus, the first switching transistor ST1 may apply a data signal from the data line DL to the first node N1 in response to the first scan signal SCAN1 of a low level, which is a turn-on level.

The second switching transistor ST2 may diode-connect the gate electrode and the drain electrode of the driving transistor DT. The second switching transistor ST2 may include a drain electrode connected to the second node N2, a source electrode connected to the third node N3, and a gate electrode connected to a second scan signal line SL2 to which a second scan signal SCAN2 is applied. The second switching transistor ST2 may be turned on or turned off by the second scan signal SCAN2. Thus, the second switching transistor ST2 may diode-connect the gate electrode and the drain electrode of the driving transistor DT in response to the second scan signal SCAN2 of a low level, which is a turn-on level.

The third switching transistor ST3 may apply a reference voltage Vref to the first node N1. The third switching transistor ST3 may include a source electrode connected to a reference voltage line which supplies the reference voltage Vref, a drain electrode connected to the first node N1, and a gate electrode connected to an emission signal line EL to which an emission signal EM is applied. The third switching transistor ST3 may be turned on or turned off by the emission signal EM. Thus, the third switching transistor ST3 may apply the reference voltage Vref to the first node N1 in response to the emission signal EM of a low level, which is a turn-on level.

The fourth switching transistor ST4 may apply the reference voltage Vref to an anode of the first light emitting diode ED1. The fourth switching transistor ST4 may include a source electrode connected to the reference voltage line which supplies the reference voltage Vref, a drain electrode connected to the anode of the first light emitting diode ED1, and a gate electrode connected to the second scan signal line SL2 to which the second scan signal SCAN2 is applied. The fourth switching transistor ST4 may be turned on or turned off by the second scan signal SCAN2. Thus, the fourth switching transistor ST4 may apply the reference voltage Vref to the anode of the first light emitting diode ED1 in response to the second scan signal SCAN2 of a low level, which is a turn-on level.

The fifth switching transistor ST5 may apply the reference voltage Vref to an anode of the second light emitting diode ED2. The fifth switching transistor ST5 may include a source electrode connected to the reference voltage line which supplies the reference voltage Vref, a drain electrode connected to the anode of the second light emitting diode ED2, and a gate electrode connected to the second scan signal line SL2 to which the second scan signal SCAN2 is applied. The fifth switching transistor ST5 may be turned on or turned off by the second scan signal SCAN2. Thus, the fifth switching transistor ST5 may apply the reference voltage Vref to the anode of the second light emitting diode ED2 in response to the second scan signal SCAN2 of a low level, which is a turn-on level.

The second capacitor C2 may include a first electrode connected to the first node N1 and a second electrode connected to the second node N2. That is, one electrode of the second capacitor C2 may be connected to the gate electrode of the driving transistor DT, and the other electrode of the second capacitor C2 may be connected to the first switching transistor ST1. The second capacitor C2 may store a predetermined voltage to maintain a constant voltage level of the gate electrode of the driving transistor DT while at least one of the plurality of light emitting diodes ED1 and ED2 emits light.

The selection circuit SC_1 may include the first transistor T1 for forming a current path of the first driving current flowing through the first light emitting diode ED1. Also, the selection circuit SC_1 may include the second transistor T2 for forming a current path of the second driving current flowing through the second light emitting diode ED2.

The first transistor T1 may be disposed between the driver circuit DC_1 and the first light emitting diode ED1. The gate electrode of the first transistor T1 may be connected to the first selection signal line SLL1 which supplies the first selection signal Ss. If the first selection signal Ss is supplied through the first selection signal line SLL1 when the pixel circuit SPC_1 is driven in the first state, the first transistor T1 may be turned on. Thus, a current path of the first driving current flowing through the first light emitting diode ED1 may be formed. In this case, the first light emitting diode ED1 may emit light.

The second transistor T2 may be disposed between the driver circuit DC_1 and the second light emitting diode ED2. The gate electrode of the second transistor T2 may be connected to the second selection signal line SLL2 which supplies the second selection signal Ps. If the second selection signal Ps is supplied through the second selection signal line SLL2 when the pixel circuit SPC_1 is driven in the second state, the second transistor T2 may be turned on. Thus, a current path of the second driving current flowing through the second light emitting diode ED2 may be formed. In this case, the second light emitting diode ED2 may emit light.

The first light emitting diode ED1 may be connected between the first transistor T1 which is turned on or turned off by the first selection signal Ss and the second power line which supplies the second power voltage VSS, e.g., the low-potential power voltage. The second light emitting diode ED2 may be connected between the second transistor T2 which is turned on or turned off by the second selection signal Ps and the second power line which supplies the second power voltage VSS, e.g., the low-potential power voltage.

In this case, the first light emitting diode ED1 or the second light emitting diode ED2 may be connected to another component of the pixel circuit SPC_1, e.g., the driving transistor DT of the driver circuit DC_1 depending on a driving mode. Herein, the driving mode may be designated by the user's input or may be determined when a predetermined condition is satisfied.

Figure 6A:
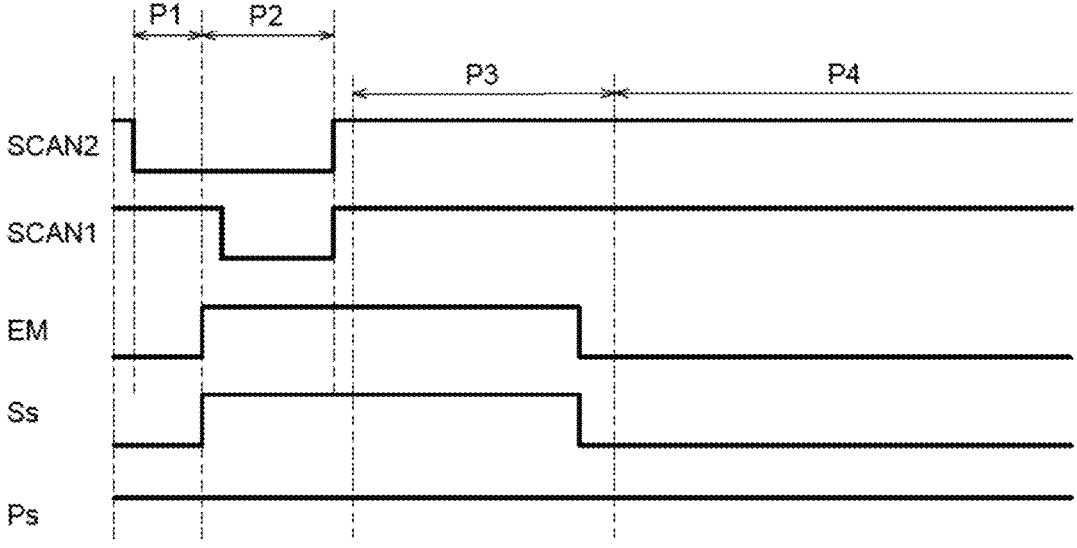
FIG. 6A and FIG. 6B are example waveform diagrams for explaining a pixel circuit of FIG. 5.
Figure 6B:
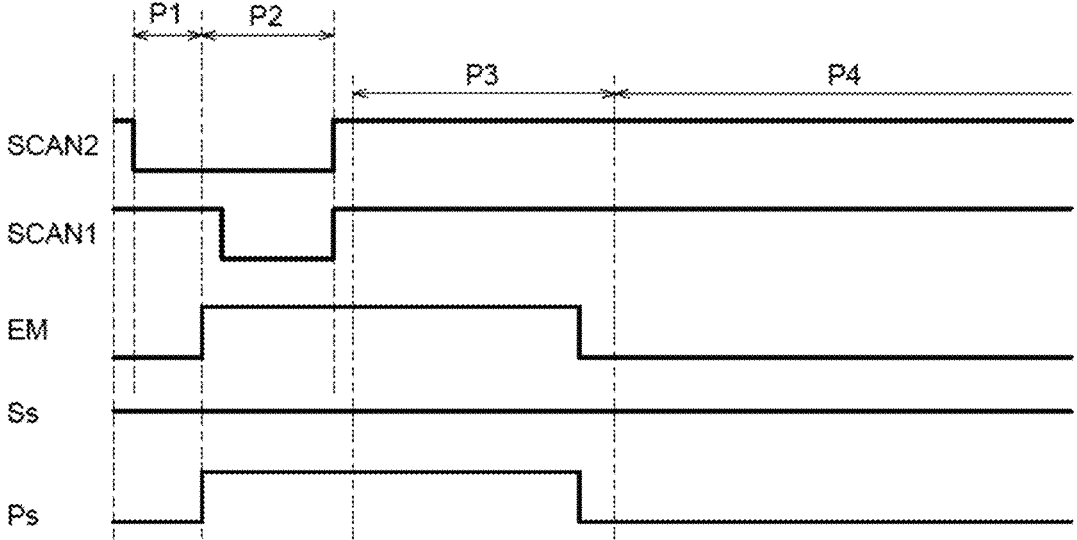

FIG. 6A and FIG. 6B are waveform diagrams for explaining the pixel circuit of FIG. 5.

Meanwhile, FIG. 6A shows a waveform diagram for explaining an example where the pixel circuit SPC_1 is driven in the first state. FIG. 6B shows a waveform diagram for explaining an example where the pixel circuit SPC_1 is driven in the second state.

Referring to FIG. 5 through FIG. 6B, when the pixel circuit SPC_1 is driven in the first state, only the first light emitting diode ED1 may emit light. Also, when the pixel circuit SPC_1 is driven in the second state, only the second light emitting diode ED2 may emit light. Herein, as shown in FIG. 6A, the second selection signal Ps for controlling the emission of the second light emitting diode ED2, i.e., the second selection signal Ps for forming a current path of the second driving current may be output only at a high level, which is a turn-off level, to allow only the first light emitting diode ED1 to emit light in the first state. Also, as shown in FIG. 6B, the first selection signal Ss for controlling the emission of the first light emitting diode ED1, i.e., the first selection signal Ss for forming a current path of the first driving current may be output only at a high level, which is a turn-off level, to allow only the second light emitting diode ED2 to emit light in the second state.

Specifically, an operation of the pixel circuit SPC_1 in the first state will be described with reference to FIG. 5 and FIG. 6A. The second scan signal SCAN2 of a low level, the first selection signal Ss of a low level, and the emission signal EM of a low level may be output in an initial period P1. The second switching transistor ST2, the fourth switching transistor ST4, and the fifth switching transistor ST5 may be turned on by the second scan signal SCAN2 of a low level. Also, the first transistor T1 may be turned on by the first selection signal Ss of a low level. Further, the third switching transistor ST3 may be turned on by the emission signal EM of a low level.

The first node N1 may be initialized to the reference voltage Vref through the turned-on third switching transistor ST3. A volage of the anode of the first light emitting diode ED1 may be initialized to the reference voltage Vref through the turned-on fourth switching transistor ST4. Also, a volage of the anode of the second light emitting diode ED2 may be initialized to the reference voltage Vref through the turned-on fifth switching transistor ST5. Further, the driving transistor DT may be diode-connected through the turned-on second switching transistor ST2 and the gate electrode and the drain electrode of the driving transistor DT may be short-circuited. Thus, the driving transistor DT may operate like a diode. Furthermore, the reference voltage Vref transmitted to the anode of the first light emitting diode ED1 through the turned-on fourth switching transistor ST4 may be transmitted to the third node N3 and the second node N2 through the turned-on first transistor T1. Thus, the third node N3 and the second node N2 may be initialized to the reference voltage Vref.

Then, the first scan signal SCAN1 of a low level, the second scan signal SCAN2 of a low level, and the first selection signal Ss of a high level may be output in a sampling period P2. When the emission signal EM of a high level is output, the third switching transistor ST3 may be turned off. At the same time, the first switching transistor ST1 may be turned on by the first scan signal SCAN1 of a low level. Thus, the data signal may be transmitted to the first node N1. Also, the driving transistor DT may be diode-connected by the turned-on second switching transistor ST2, and a voltage difference between the first power voltage VDD and a threshold voltage may be sampled and then supplied to the second node N2.

Further, the first scan signal SCAN1 and the second scan signal SCAN2 may be output at a high level in a holding period. Thus, all of the first switching transistor ST1, the second switching transistor ST2, the fourth switching transistor ST4, and the fifth switching transistor ST5 may be turned off. However, even when the first switching transistor ST1 is turned off, the data signal (data voltage) input in the previous period (e.g., sampling period P2) may be maintained by the second capacitor C2.

Finally, the first selection signal Ss of a low level, the emission signal EM of a low level, and the second selection signal Ps of a high level may be output in an emission period P4. The reference voltage Vref may be applied to the first node N1 through the third switching transistor ST3 which is turned on by the emission signal EM of a low level. A voltage of the first node N1 may be a voltage differential between the reference voltage Vref and the data signal (data voltage). Such a voltage variation may be reflected to the second node N2. A gate-source voltage of the driving transistor DT may be set to a value Vdata−Vref+Vth obtained by subtracting the reference voltage Vref from the data signal (data voltage) and adding the data signal (data voltage). Thus, the first driving current may be controlled.

Also, the first driving current may be supplied from the driving transistor DT to the first light emitting diode ED1 through the turned-on first transistor T1. Thus, the first light emitting diode ED1 may emit light. However, the second selection signal Ps is output at a high level, and, thus, the second transistor T2 is turned off. Therefore, the second driving current cannot be transmitted from the driving transistor DT to the second light emitting diode ED2. Accordingly, when the pixel circuit SPC_1 is driven in the first state, the first driving current may be applied only to the first light emitting diode ED1. Thus, only the first light emitting diode ED1 may emit light.

Hereinafter, an operation of the pixel circuit SPC_1 in the second state will be described with reference to FIG. 5 and FIG. 6B. The pixel circuit SPC_1 may be driven in the second state in substantially the same manner as in the first state except that the first selection signal Ss and the second selection signal Ps are output reversely to the first state. That is, the first selection signal Ss may be output only at a high level, which is a turn-off level. Also, the second selection signal Ps may be output at a low level, which is a turn-on level, during the emission period P4 in which the second light emitting diode ED2 emits light.

Specifically, the first scan signal SCAN1 of a high level and the second scan signal SCAN2 of a low level may be output in the initial period P1. Also, the first selection signal Ss may be output at a high level, and the second selection signal Ps and the emission signal EM may be output at a low level. Thus, the second switching transistor ST2, the fourth switching transistor ST4, and the fifth switching transistor ST5 may be turned on by the second scan signal SCAN2. Further, the second transistor T2 may be turned on by the second selection signal Ps, and the third switching transistor ST3 may be turned on by the emission signal EM.

The first node N1 may be initialized to the reference voltage Vref through the third switching transistor ST3 which is turned on by the emission signal EM. The anodes of the first light emitting diode ED1 and the second light emitting diode ED2 may be initialized to the reference voltage Vref by the fourth switching transistor ST4 and the fifth switching transistor ST5, respectively, which are turned on by the second scan signal SCAN2. Further, the driving transistor DT may be diode-connected through the turned-on second switching transistor ST2 and may operate like a diode. Finally, the reference voltage Vref transmitted to the anode of the second light emitting diode ED2 through the turned-on fifth switching transistor ST5 may be transmitted to the third node N3 and the second node N2 through the turned-on second transistor T2. Thus, the third node N3 and the second node N2 may be initialized to the reference voltage Vref.

Then, the first scan signal SCAN1 of a low level and the second scan signal SCAN2 of a low level may be output in the sampling period P2. Also, the second selection signal Ps and the emission signal EM may be output from a low level to a high level in the sampling period P2. When the emission signal EM of a high level is output, the third switching transistor ST3 may be turned off. When the first switching transistor ST1 is turned on by the first scan signal SCAN1 of a low level, the data signal may be transmitted to the first node N1. Also, the driving transistor DT may be diode-connected through the turned-on second switching transistor ST2, and a voltage difference between the first power voltage VDD and the threshold voltage may be sampled and then supplied to the second node N2.

Finally, the second selection signal Ps of a low level, the emission signal EM of a low level, and the first selection signal Ss of a high level may be output in the emission period P4. The reference voltage Vref may be applied to the first node N1 through the third switching transistor ST3 which is turned on by the emission signal EM of a low level. A voltage of the first node N1 may be a voltage difference between the reference voltage Vref and the data signal (data voltage). Such a voltage variation may be reflected to the second node N2. A gate-source voltage of the driving transistor DT may be set to a value Vdata-Vref+Vth obtained by subtracting the reference voltage Vref from the data signal (data voltage) and adding the data signal (data voltage). Thus, the second driving current may be controlled.

Also, the second driving current may be supplied from the driving transistor DT to the second light emitting diode ED2 through the turned-on second transistor T2. Thus, the second light emitting diode ED2 may emit light. However, the first selection signal Ss is output at a high level, and, thus, the first transistor T1 is turned off. Therefore, the first driving current cannot be transmitted from the driving transistor DT to the first light emitting diode ED1. Accordingly, when the pixel circuit SPC_1 is driven in the second state, the second driving current may be applied only to the second light emitting diode ED2. Thus, only the second light emitting diode ED2 may emit light.

Figure 7:
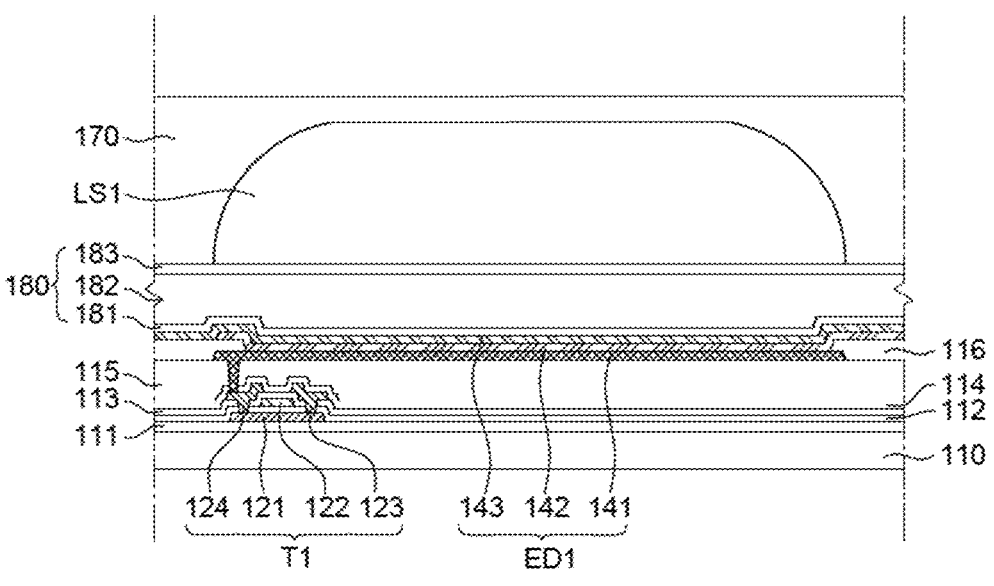
FIG. 7 and FIG. 8 are cross-sectional views of the display device according to an example embodiment of the present disclosure.
Figure 8:
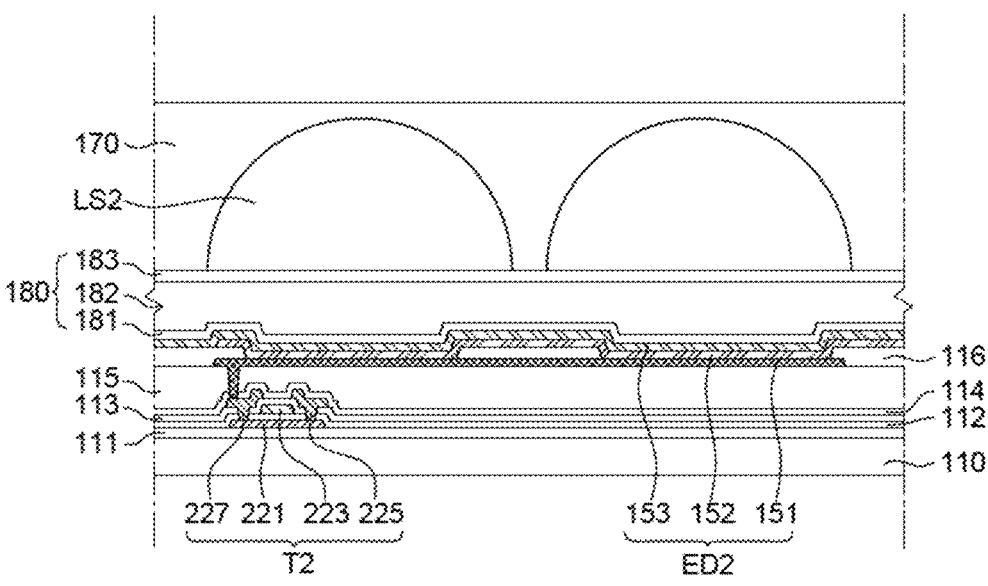

FIG. 7 and FIG. 8 are cross-sectional views of the display device according to an example embodiment of the present disclosure.

FIG. 7 illustrates a pixel in which a first lens LS1 is disposed, and FIG. 8 illustrates a pixel in which a second lens LS2 is disposed.

Referring to FIG. 7 and FIG. 8, the display device 100 according to an example embedment of the present disclosure may include a substrate 110, a buffer film 111, a gate insulating film 112, and an interlayer insulating film 113. Also, the display device 100 may include a lower protection film 114, an overcoating layer 115, a bank insulating film 116, the first transistor T1, and the second transistor T2. Further, the display device 100 may include the first light emitting diode ED1, the second light emitting diode ED2, the first lens LS1, the second lens LS2, a lens protection film 170, and an encapsulation member 180.

The substrate 110 may contain an insulating material. The substrate 110 may contain a transparent material. For example, the substrate 110 may contain glass or plastic.

The buffer film 111 may be disposed on the substrate 110. The buffer film 111 may contain an insulating material. For example, the buffer film 111 may contain an inorganic insulating material, such as silicon oxide (SiOx) and silicon nitride (SiNx). The buffer film 111 may have a multilayer structure. For example, the buffer film 111 may have a structure in which a film of silicon nitride (SiNx) and a film of silicon oxide (SiOx) are laminated.

The buffer film 111 may be located between the substrate 110 and a driving portion, e.g., the driver circuit DC, of each pixel PX. The buffer film 111 may suppress contamination caused by the substrate 110 in a process of forming the driving portion. For example, an upper surface of the substrate 110 directed toward the driving portion of each pixel PX may be covered by the buffer film 111. The driving portion of each pixel PX may be located on the buffer film 111.

The gate insulating film 112 may be disposed on the buffer film 111. The gate insulating film 112 may contain an insulating material. For example, the gate insulating film 112 may contain an inorganic insulating material, such as silicon oxide (SiO) and silicon nitride (SiN). The gate insulating film 112 may contain a material having a high dielectric constant. For example, the gate insulating film 112 may contain a high-K material, such as hafnium oxide (HfO). The gate insulating film 112 may have a multilayer structure.

The gate insulating film 112 may extend between a semiconductor layer 121 or 221 and a gate electrode 122 or 223 of the transistor T1 or T2, respectively. For example, the gate electrodes of the driving transistor DT and the switching transistor ST may be insulated from the semiconductor layers of the driving transistor DT and the switching transistor ST by the gate insulating film 112. The gate insulating film 112 may cover a semiconductor layer of each pixel PX. The gate electrodes of the driving transistor DT and the switching transistor ST may be located on the gate insulating film 112.

The interlayer insulating film 113 may be disposed on the gate insulating film 112. The interlayer insulating film 113 may contain an insulating material. For example, the interlayer insulating film 113 may contain an inorganic insulating material, such as silicon oxide (SiO) and silicon nitride (SiN). The interlayer insulating film 113 may extend between the gate electrode and the source electrode and between the gate electrode and the drain electrode of each of the driving transistor DT and the switching transistor ST. For example, the source electrode and the drain electrode of each of the driving transistor DT and the switching transistor ST may be insulated from the gate electrode by the interlayer insulating film 113. The interlayer insulating film 113 may cover the gate electrode of each of the driving transistor DT and the switching transistor ST. A source electrode and a drain electrode of each pixel PX may be located on the interlayer insulating film 113. The gate insulating film 112 and the interlayer insulating film 113 may expose a source region and a drain region of each semiconductor pattern located in each pixel PX.

The lower protection film 114 may be disposed on the interlayer insulating film 113. The lower protection film 114 may contain an insulating material. For example, the lower protection film 114 may contain an inorganic insulating material, such as silicon oxide (SiO) and silicon nitride (SiN). The lower protection film 114 may suppress damage to the driving portion caused by external moisture and impacts. The lower protection film 114 may extend along surfaces of the driving transistor DT and the switching transistor ST which face the substrate 110. The lower protection film 114 may be in contact with the interlayer insulating film 113 outside the driving portion located in each pixel PX.

The overcoating layer 115 may be disposed on the lower protection film 114. The overcoating layer 115 may contain an insulating material. The overcoating layer 115 may contain a different material from the lower protection film 114. For example, the overcoating layer 115 may contain an organic insulating material. The overcoating layer 115 may remove a step difference caused by the driving portion of each pixel PX. For example, an upper surface of the overcoating layer 115 facing the substrate 110 may be a flat surface.

The first transistor T1 and the second transistor T2 may be disposed on the substrate 110. The first transistor T1 may be electrically connected between the drain electrode of the driving transistor DT and a first lower electrode 141 of the first light emitting diode ED1. The second transistor T2 may be electrically connected between the drain electrode of the driving transistor DT and a second lower electrode 151 of the second light emitting diode ED2.

The first transistor T1 may include a first semiconductor layer 121, a first gate electrode 122, a first source electrode 123, and a first drain electrode 124. The first transistor T1 may have the same structure as the switching transistor ST and the driving transistor DT. For example, the first semiconductor layer 121 may be located between the buffer film 111 and the gate insulating film 112. Also, the first gate electrode 122 may be located between the gate insulating film 112 and the interlayer insulating film 113. The first source electrode 123 and the first drain electrode 124 may be located between the interlayer insulating film 113 and the lower protection film 114. The first gate electrode 122 may overlap a channel region of the first semiconductor layer 121. The first source electrode 123 may be electrically connected to a source region of the first semiconductor layer 121. The first drain electrode 124 may be electrically connected to a drain region of the first semiconductor layer 121.

The second transistor T2 may include a second semiconductor layer 221, a second gate electrode 223, a second source electrode 225, and a second drain electrode 227. For example, the second semiconductor layer 221 may be located on the same layer as the first semiconductor layer 121, and the second gate electrode 223 may be located on the same layer as the first gate electrode 122. Also, the second source electrode 225 and the second drain electrode 227 may be located on the same layer as the first source electrode 123 and the first drain electrode 124.

The first light emitting diode ED1 and the second light emitting diode ED2 of each pixel PX may be disposed on the overcoating layer 115 of the pixel PX.

The first light emitting diode ED1 may emit light of a specific color. For example, the first light emitting diode ED1 may include the first lower electrode 141, a first emission layer 142, and a first upper electrode 143 which are sequentially laminated on the substrate 110.

The first lower electrode 141 may contain a conductive material. The first lower electrode 141 may contain a material having a high reflectivity. For example, the first lower electrode 141 may contain a metal, such as aluminum (Al) and silver (Ag). The first lower electrode 141 may have a multilayer structure. For example, the first lower electrode 141 may have a structure in which a reflective electrode made of a metal is located between transparent electrodes made of a transparent conductive material, such as ITO and IZO. The first lower electrode 141 may be electrically connected to the first drain electrode 124 of the first transistor T1 through a contact hole penetrating the lower protection film 114 and the overcoating layer 115.

The first emission layer 142 may generate light with a luminance corresponding to a voltage difference between the first lower electrode 141 and the first upper electrode 143. For example, the first emission layer 142 may include an emission material layer EML containing a light emitting material. The light emitting material may include an organic material, an inorganic material or a hybrid material.

The first emission layer 142 may have a multilayer structure. For example, the first emission layer 142 may further include at least one of a hole injection layer HIL, a hole transport layer HTL, an electron transport layer ETL, and an electron injection layer EIL.

The first upper electrode 143 may contain a conductive material. The first upper electrode 143 may contain a different material from the first lower electrode 141. The first upper electrode 143 may have a higher transmittance than the first lower electrode 141. For example, the first upper electrode 143 may be a transparent electrode made of a transparent conductive material, such as ITO and IZO. Therefore, in the display device 100 according to an example embodiment of the present disclosure, light generated by the first emission layer 142 may be emitted through the first upper electrode 143.

The second light emitting diode ED2 may implement the same color as the first light emitting diode ED1. The second light emitting diode ED2 may have the same structure as the first light emitting diode ED1. For example, the second light emitting diode ED2 may include the second lower electrode 151, a second emission layer 152, and a second upper electrode 153 which are sequentially laminated on the substrate 110.

The second lower electrode 151 may correspond to the first lower electrode 141, the second emission layer 152 may correspond to the first emission layer 142, and the second upper electrode 153 may correspond to the first upper electrode 143. For example, the second lower electrode 151 may be provided in the second light emitting diode ED2 so as to have the same structure as the first lower electrode 141. The same applies to the second emission layer 152 and the second upper electrode 153. For example, the first light emitting diode ED1 and the second light emitting diode ED2 may be configured to have the same structure. However, the present disclosure is not limited thereto. In some embodiments, at least some components of the first light emitting diode ED1 and the second light emitting diode ED2 may be configured differently from each other.

The second emission layer 152 may be spaced apart from the first emission layer 142. Therefore, in the display device according to an example embodiment of the present disclosure, it is possible to suppress light emission caused by a leakage current.

The second lower electrode 151 of each pixel PX may be spaced apart from the first lower electrode 141 of the pixel PX. For example, the bank insulating film 116 may be disposed between the first lower electrode 141 and the second lower electrode 151 of each pixel PX. The bank insulating film 116 may contain an insulating material. For example, the bank insulating film 116 may contain an organic insulating material. The bank insulating film 116 may contain a different material from the overcoating layer 115.

The second lower electrode 151 of each pixel PX may be insulated from the first lower electrode 141 of the pixel PX by the bank insulating film 116. For example, the bank insulating film 116 may cover an edge of the first lower electrode 141 and an edge of the second lower electrode 151 located in each pixel PX. Therefore, in the display device 100, an image formed by a first lens area of each pixel PX where the first light emitting diode ED1 is located or an image formed by a second lens area of each pixel PX where the second light emitting diode ED2 is located may be supplied to the user.

The first emission layer 142 and the first upper electrode 143 of the first light emitting diode ED1 located in each pixel PX may be laminated on a portion of the first lower electrode 141 exposed by the bank insulating film 116. The second emission layer 152 and the second upper electrode 153 of the second light emitting diode ED2 located in each pixel PX may be laminated on a portion of the second lower electrode 151 exposed by the bank insulating film 116. For example, the bank insulating film 116 may distinguish a first emission area in which light from the first light emitting diode ED1 in each pixel PX is emitted from a second emission area in which light from the second light emitting diode ED2 is emitted. The second emission area distinguished in each pixel PX may be smaller in size than the first emission area.

The second upper electrode 153 of each pixel PX may be electrically connected to the first upper electrode 143 of the pixel PX. For example, a voltage to be applied to the second upper electrode 153 of the second light emitting diode ED2 located in each pixel PX may be equal to a voltage to be applied to the first upper electrode 143 of the first light emitting diode ED1 located in the pixel PX. The second upper electrode 153 of each pixel PX may contain the same material as the first upper electrode 143 of the pixel PX. For example, the second upper electrode 153 of each pixel PX may be formed at the same time as the first upper electrode 143 of the pixel PX. The second upper electrode 153 of each pixel PX may extend onto the bank insulating film 116 so as to be in direct contact with the first upper electrode 143 of the pixel PX. A luminance of each of the first lens area and the second lens area located in each pixel PX may be controlled by a driving current generated in the pixel PX.

The encapsulation member 180 may be located on the first light emitting diode ED1 and the second light emitting diode ED2 of each pixel PX. The encapsulation member 180 may suppress damage to the plurality of light emitting diodes ED1 and ED2 caused by external moisture and impacts. The encapsulation member 180 may have a multilayer structure. For example, the encapsulation member 180 may include a first encapsulation layer 181, a second encapsulation layer 182, and a third encapsulation layer 183 which are sequentially laminated, but is not limited thereto. Each of the first encapsulation layer 181, the second encapsulation layer 182, and the third encapsulation layer 183 may contain an insulating material. The second encapsulation layer 182 may contain a different material from the first encapsulation layer 181 and the third encapsulation layer 183. For example, the first encapsulation layer 181 and the third encapsulation layer 183 may be inorganic encapsulation layers containing an inorganic insulating material, and the second encapsulation layer 182 may be an organic encapsulation layer containing an organic insulating material. Therefore, it is possible to more effectively suppress damage to the plurality of light emitting diodes ED1 and ED2 of the display device 100 caused by external moisture and impacts.

The first lens LS1 and the second lens LS2 may be disposed on the encapsulation member 180.

The first lens LS1 may be disposed on the first light emitting diode ED1. Light generated by the first light emitting diode ED1 of each pixel PX may be emitted through the first lens LS1 of the pixel PX. The first lens LS1 may have a shape in which light in at least one direction may not be limited. For example, the first lens LS1 located in each pixel PX may have a bar shape extending in one direction in a plan view.

In this case, a direction of light emitted from the first lens area of each pixel PX may not be limited to the one direction. For example, content (or images) supplied through the first lens area of each pixel PX may be shared with people adjacent to the user in the one direction. Therefore, content supplied by light emitted through the first lens LS1 may be displayed in a first viewing angle range wider than that of content supplied by light emitted through the second lens LS2. For example, the content supplied by light emitted through the first lens LS1 may be supplied in the share mode.

The second lens LS2 may be disposed on the second light emitting diode ED2. Light generated by the second light emitting diode ED2 of each pixel PX may be emitted through the second lens LS2 of the pixel PX. The second lens LS2 may limit a direction of light passing through the second lens LS2 to the one direction and/or another direction. For example, the second lens LS2 located in each pixel PX may have a circular shape in a plan view.

In this case, a direction of light emitted from the second lens area of each pixel PX may be limited to the one direction and/or the other direction. For example, content (or images) supplied through the second lens area of each pixel PX may not be shared with people adjacent to the user. Therefore, content supplied by light emitted through the second lens LS2 may be displayed in a second viewing angle range narrower than that of content supplied by light emitted through the first lens LS1. For example, the content supplied by light emitted through the second lens LS2 may be supplied in the private mode.

The first emission area of each pixel PX may correspond in shape to the first lens LS1 of the pixel PX. For example, the first emission area of each pixel PX may have a bar shape extending in one direction in a plan view. The first lens LS1 may be greater in size than the first emission area of the pixel PX. Therefore, the efficiency of light emitted from the first emission area of the pixel PX may be improved.

The second emission area of each pixel PX may correspond in shape to the second lens LS2 of the pixel PX. For example, the second emission area of each pixel PX may have a circular shape in a plan view. The second lens LS2 may be greater in size than the second emission area of the pixel PX. Therefore, the efficiency of light emitted from the second emission area of the pixel PX may be improved.

The lens protection film 170 may be located on the first lens LS1 and the second lens LS2 of the pixel PX. The lens protection film 170 may contain an insulating material. For example, the lens protection film 170 may contain an organic insulating material. The lens protection film 17 may have a smaller refractive index than the first lens LS1 and the second lens LS2 located in each pixel PX. Therefore, in the display device 100 according to an example embodiment of the present disclosure, light passing through the first lens LS1 and the second lens LS2 of each pixel PX may not be refracted toward the substrate 110 due to a difference in refractive index from the lens protection film 170.

Referring to FIG. 7 and FIG. 8, the pixel PX may include the first lens LS1 disposed on the first light emitting diode ED1 and the second lens LS2 disposed on the second light emitting diode ED2 as described above. However, the present disclosure is not limited there.

For example, the pixel PX may also include a plurality of first lenses LS1 disposed on each of the first light emitting diode ED1 and the second light emitting diode ED2. Details thereof will be described below with reference to FIG. 9A and FIG. 9B.

Figure 9A:
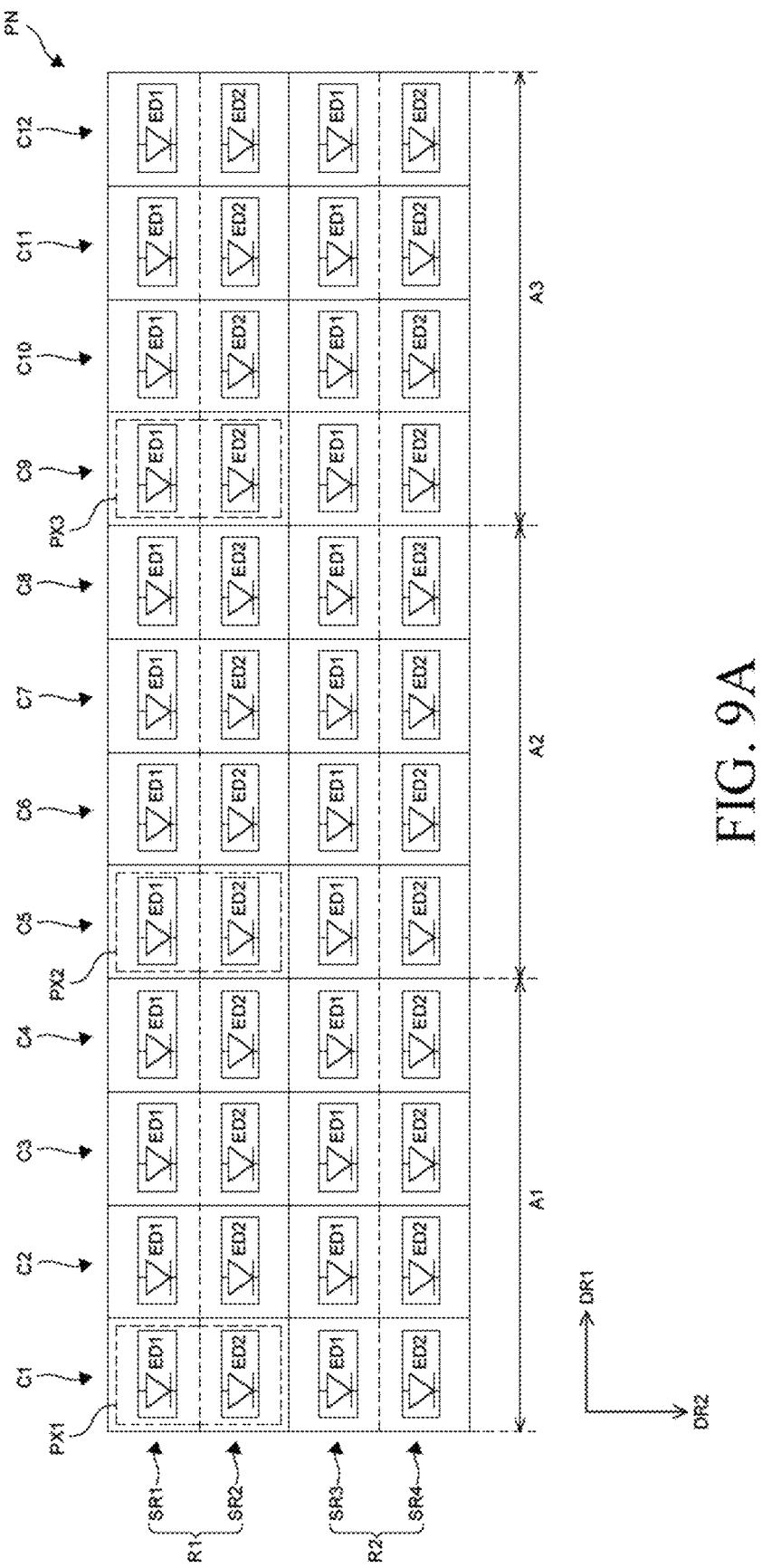
FIG. 9A and FIG. 9B illustrate an example of the display panel included in the display device according to an example embodiment of the present disclosure.
Figure 9B:
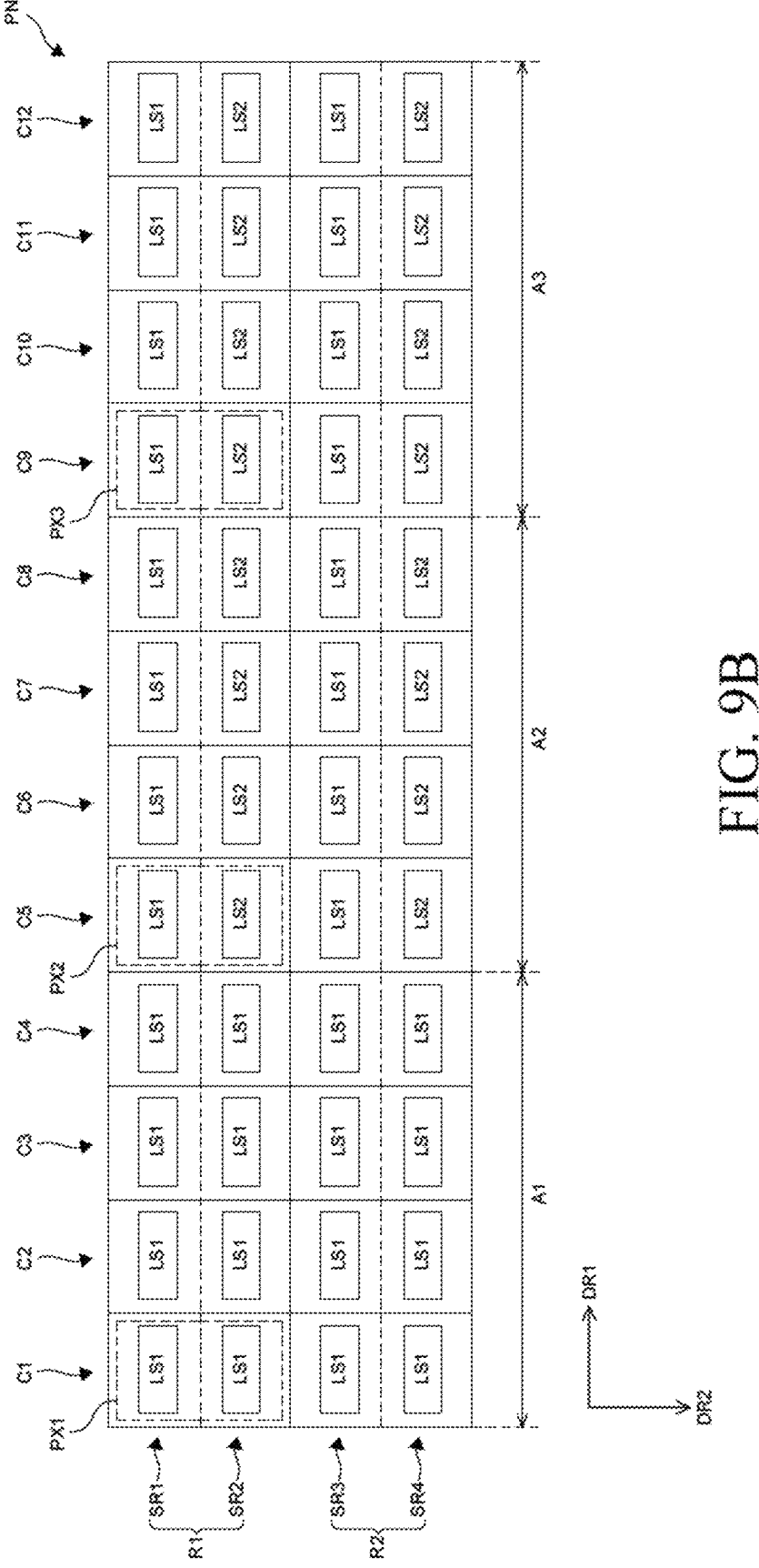

FIG. 9A and FIG. 9B illustrate an example of the display panel included in the display device according to an example embodiment of the present disclosure.

Meanwhile, FIG. 9A and FIG. 9B illustrate an example of the display panel PN included in the display device 100 according to an example embodiment of the present disclosure of FIG. 2 and FIG. 3 and including the first to third areas A1, A2 and A3.

Also, FIG. 9A and FIG. 9B illustrate that the first area A1 of the display panel includes eight first pixels PX1 disposed in two rows R1 and R2 and four columns C1 to C4. Further, FIG. 9A and FIG. 9B illustrate that the second area A2 of the display panel PN include eight second pixels PX2 disposed in the two rows R1 and R2 and four columns C5 to C8. Furthermore, FIG. 9A and FIG. 9B illustrate that the third area A3 of the display panel PN includes eight third pixels PX3 disposed in the two rows R1 and R2 and four columns C4 to C12. Herein, the numbers of pixels disposed in the respective areas A1, A2 and A3 of the display panel PN are merely examples for the convenience of description. However, the present disclosure is not limited thereto. Each of the areas A1, A2 and A3 of the display panel PN may include a plurality of pixels disposed in various numbers of rows and various numbers of columns.

Meanwhile, FIG. 9A and FIG. 9B illustrate only a plurality of light emitting diodes and a plurality of lenses among the components included in each of the first pixel PX1, the second pixel PX2, and the third pixel PX3 for the convenience of description. Herein, the plurality of light emitting diodes and the plurality of lenses are schematically illustrated only for the relative relationship of positions for the convenience of description.

Referring to FIG. 9A and FIG. 9B, the display panel PN may be divided into the plurality of areas A1, A2 and A3. For example, as described above with reference to FIG. 3, the display panel PN may include the first area A1, the second area A2, and the third area A3.

Each of the areas A1, A2 and A3 included in the display panel PN may include a plurality of pixels PX each including a pixel circuit. For example, as described above with reference to FIG. 3, the first area A1 of the display panel PN may include a plurality of first pixels PX1, the second area A2 of the display panel PN may include a plurality of second pixels PX2, and the third area A3 of the display panel PN may include a plurality of third pixels PX3.

A plurality of first pixels PX1, a plurality of second pixels PX2, and a plurality of third pixels PX3 may be sequentially disposed in a first row R1 along the first direction DR1.

For example, the plurality of first pixels PX1 in the first row R1 of the first area A1 may be sequentially disposed in a first column C1, a second column C2 adjacent to the first column C1 in the first direction DR1, a third column C3 adjacent to the second column C2 in the first direction DR1, and a fourth column C4 adjacent to the third column C3 in the first direction DR1.

Also, the plurality of second pixels PX2 in the first row R1 of the second area A2 may be sequentially disposed in the fourth column C4, a fifth column C5 adjacent to the fourth column C4 in the first direction DR1, a sixth column C6 adjacent to the fifth column C5 in the first direction DR1, a seventh column C7 adjacent to the sixth column C6 in the first direction DR1, and an eighth column C8 adjacent to the seventh column C7 in the first direction DR1.

Further, the plurality of third pixels PX3 in the first row R1 of the third area A3 may be sequentially disposed in a ninth column C9 adjacent to the eighth column C8 in the first direction DR1, a tenth column C10 adjacent to the ninth column C9 in the first direction DR1, an eleventh column C11 adjacent to the tenth column C10 in the first direction DR1, and a twelfth column C12 adjacent to the eleventh column C11 in the first direction DR1.

A plurality of first pixels PX1, a plurality of second pixels PX2, and a plurality of third pixels PX3 may be sequentially disposed along the first direction DR1 in a second row R2 adjacent to the first row R1 in the second direction DR2.

For example, the plurality of first pixels PX1 in the second row R2 of the first area A1 may be sequentially disposed in the first to fourth columns C1 to C4. Also, the plurality of second pixels PX2 in the second row R2 of the second area A2 may be sequentially disposed in the fifth to eighth columns C5 to C8. Further, the plurality of third pixels PX3 in the second row R2 of the third area A3 may be sequentially disposed in the ninth to twelfth columns C9 to C12.

Each of the first row R1 and the second row R2 may be divided into a plurality of sub-rows. The first row R1 may include a first sub-row SR1 and a second sub-row SR2 adjacent to the first sub-row SR1 in the second direction DR2. Also, the second row R2 may include a third sub-row SR3 adjacent to the second sub-row SR2 in the second direction DR2 and a fourth sub-row SR4 adjacent to the third sub-row SR3 in the second direction DR2.

Each of the plurality of first pixels PX1 disposed in the first area A1 may include the first light emitting diode ED1 and the second light emitting diode ED2.

For example, the first light emitting diode ED1 included in each of the plurality of first pixels PX1 disposed in the first row R1 among the plurality of first pixels PX1 disposed in the first area A1 may be disposed in the first sub-row SR1. Also, the second light emitting diode ED2 included in each of the plurality of first pixels PX1 disposed in the first row R1 may be disposed in the second sub-row SR2.

Further, the first light emitting diode ED1 included in each of the plurality of first pixels PX1 disposed in the second row R2 among the plurality of first pixels PX1 disposed in the first area A1 may be disposed in the third sub-row SR3. Furthermore, the second light emitting diode ED2 included in each of the plurality of first pixels PX1 disposed in the second row R2 may be disposed in the fourth sub-row R4.

Each of the plurality of second pixels PX2 disposed in the second area A2 may include the first light emitting diode ED1 and the second light emitting diode ED2.

For example, the first light emitting diode ED1 included in each of the plurality of second pixels PX2 disposed in the first row R1 among the plurality of second pixels PX2 disposed in the second area A2 may be disposed in the first sub-row SR1. Also, the second light emitting diode ED2 included in each of the plurality of second pixels PX2 disposed in the first row R1 may be disposed in the second sub-row SR2.

Further, the first light emitting diode ED1 included in each of the plurality of second pixels PX2 disposed the second row R2 among the plurality of second pixels PX2 disposed in the second area A2 may be disposed in the third sub-row SR3. Furthermore, the second light emitting diode ED2 included in each of the plurality of second pixels PX2 disposed in the second row R2 may be disposed in the fourth sub-row R4.

Each of the plurality of third pixels PX3 disposed in the third area A3 may include the first light emitting diode ED1 and the second light emitting diode ED2.

For example, the first light emitting diode ED1 included in each of the plurality of third pixels PX3 disposed in the first row R1 among the plurality of third pixels PX3 disposed in the third area A3 may be disposed in the first sub-row SR1. Also, the second light emitting diode ED2 included in each of the plurality of third pixels PX3 disposed in the first row R1 may be disposed in the second sub-row SR2.

Further, the first light emitting diode ED1 included in each of the plurality of third pixels PX3 disposed the second row R2 among the plurality of third pixels PX3 disposed in the third area A3 may be disposed in the third sub-row SR3. Furthermore, the second light emitting diode ED2 included in each of the plurality of third pixels PX3 disposed in the second row R2 may be disposed in the fourth sub-row R4.

Each of the plurality of first pixels PX1 disposed in the first area A1 may include two first lenses LS1 disposed on the first light emitting diode ED1 and the second light emitting diode ED2. Therefore, a plurality of first lenses LS1 may be disposed in each of the adjacent sub-rows SR1 to SR4 and the adjacent columns C1 to C4 in the first area A1. In other words, only the first lens LS1 may be disposed in the first area A1 in which the first pixel PX1 is disposed.

Each of the plurality of second pixels PX2 disposed in the second area A2 may include a first lens LS1 disposed on the first light emitting diode ED1 and a second lens LS2 disposed on the second light emitting diode ED2.

For example, the first lens LS1 included in each of the plurality of second pixels PX2 disposed in the first row R1 among the plurality of second pixels PX2 disposed in the second area A2 may be disposed on the first light emitting diode ED1 in the first sub-row SR1. Also, the second lens LS2 included in each of the plurality of second pixels PX2 disposed in the first row R1 may be disposed on the second light emitting diode ED2 in the second sub-row SR2.

Further, the first lens LS1 included in each of the plurality of second pixels PX2 disposed in the second row R2 among the plurality of second pixels PX2 disposed in the second area A2 may be disposed on the first light emitting diode ED1 in the third sub-row SR3. Furthermore, the second lens LS2 included in each of the plurality of second pixels PX2 disposed in the second row R2 may be disposed on the second light emitting diode ED2 in the fourth sub-row R4.

Each of the plurality of third pixels PX3 disposed in the third area A3 may include a first lens LS1 disposed on the first light emitting diode ED1 and a second lens LS2 disposed on the second light emitting diode ED2.

For example, the first lens LS1 included in each of the plurality of third pixels PX3 disposed in the first row R1 among the plurality of third pixels PX3 disposed in the third area A3 may be disposed on the first light emitting diode ED1 in the first sub-row SR1. Also, the second lens LS2 included in each of the plurality of third pixels PX3 disposed in the first row R1 may be disposed on the second light emitting diode ED2 in the second sub-row SR2.

Further, the first lens LS1 included in each of the plurality of third pixels PX3 disposed in the second row R2 among the plurality of third pixels PX3 disposed in the third area A3 may be disposed on the first light emitting diode ED1 in the third sub-row SR3. Furthermore, the second lens LS2 included in each of the plurality of third pixels PX3 disposed in the second row R2 may be disposed on the second light emitting diode ED2 in the fourth sub-row R4.

Figure 10:
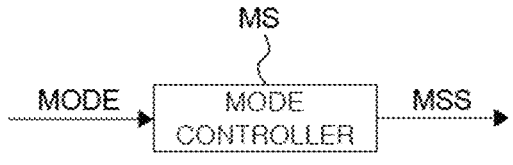
FIG. 10 is a block view illustrating an example of a mode controller included in the display device according to an example embodiment of the present disclosure.
Figure 11A:
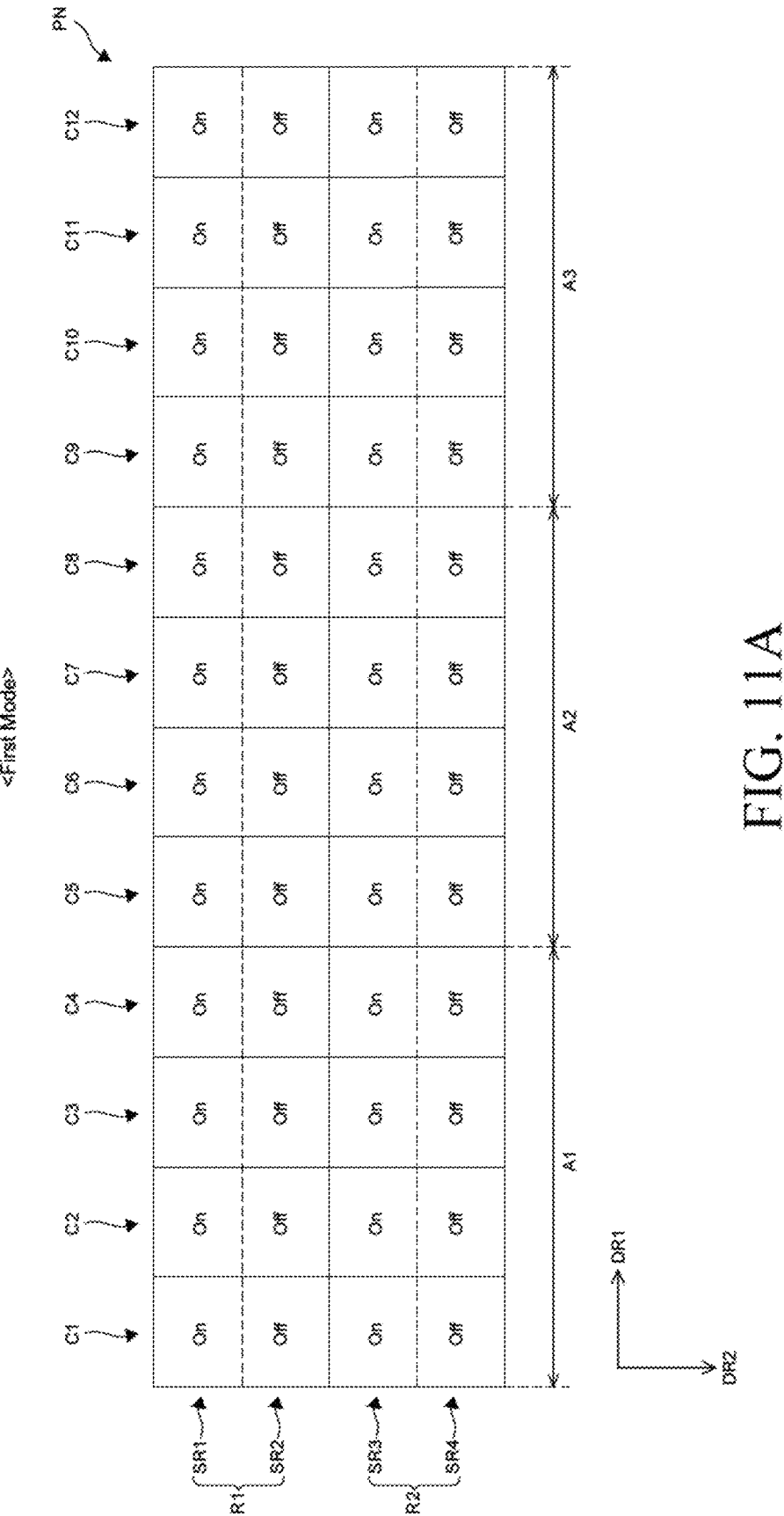
FIG. 11A illustrates an example where the display panel included in the display device according to an example embodiment of the present disclosure is driven in a first mode.
Figure 11B:
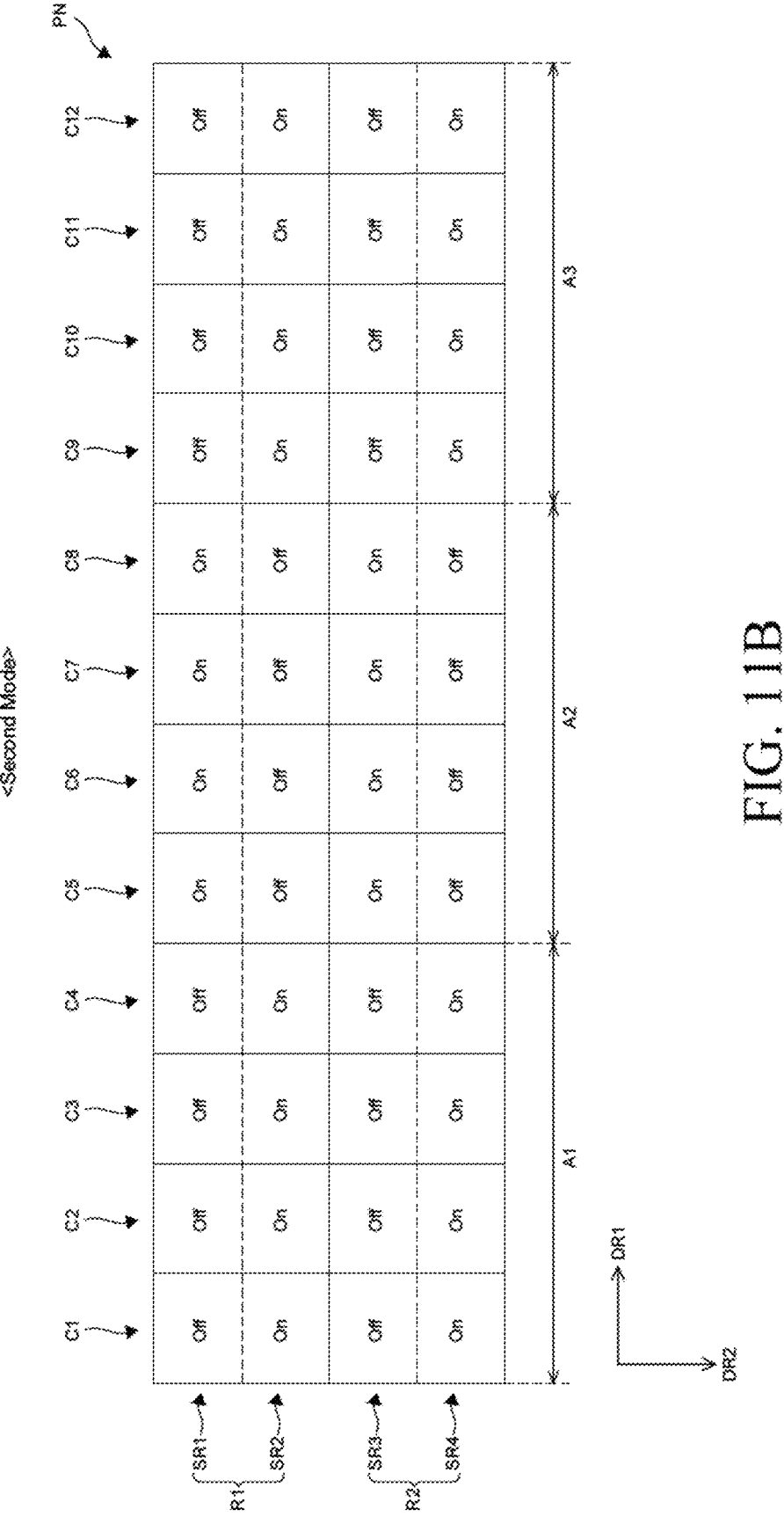
FIG. 11B illustrates an example where the display panel included in the display device according to an example embodiment of the present disclosure is driven in a second mode.

FIG. 10 is a block view illustrating an example of a mode controller included in the display device according to an example embodiment of the present disclosure. FIG. 11A illustrates an example where the display panel included in the display device according to an example embodiment of the present disclosure is driven in the first mode. FIG. 11B illustrates an example where the display panel included in the display device according to an example embodiment of the present disclosure is driven in the second mode.

Meanwhile, for the convenience of description, FIG. 11A and FIG. 11B illustrate that each of the light emitting diodes disposed in each of the plurality of sub-rows SR1 to SR4 and the plurality of columns C1 to C12 in the first mode and second mode, respectively, emits light, which is shown as "On". Also, FIG. 11A and FIG. 11B illustrate that each of the light emitting diodes disposed in each of the plurality of sub-rows SR1 to SR4 and the plurality of columns C1 to C12 in the first mode and the second mode, respectively, does not emit light, which is shown as "Off".

Referring to FIG. 2, FIG. 3, FIG. 4, FIG. 7 through FIG. 9B, and FIG. 10, the mode controller MS included in the display device 100 may generate the mode selection signal MSS based on a mode signal MODE input from the outside. For example, the mode controller MS may receive the mode signal MODE depending on a driving mode of the display device 100, generate the mode selection signal MSS based on the mode signal MODE, and supply the mode selection signal MSS to the mode selector MD.

The mode selector MD may supply the first selection signal Ss through the first selection signal line SSL1 or the second selection signal Ps through the second selection signal line SSL2 in response to the mode selection signal MSS.

Specifically, when the display device 100 is driven in the first mode, the mode selector MD may supply the first selection signal Ss to the first to third areas A1, A2 and A3 of the display panel PN. Thus, all of the first to third areas A1, A2 and A3 may be driven in the share mode.

For example, referring to FIG. 11A, in the first mode, the first selection signal Ss may be supplied to each of the plurality of first pixels PX1 disposed in the first area A1, the plurality of second pixels PX2 disposed in the second area A2, and the plurality of third pixels PX3 disposed in the third area A3 through the first selection signal line SSL1. Thus, the plurality of first pixels PX1, the plurality of second pixels PX2, and the plurality of third pixels PX3 disposed in the first row R1 and the second row R2 are driven in the first state by the first selection signal Ss. Therefore, the first driving current is generated. Accordingly, a plurality of first light emitting diodes ED1 disposed in the first sub-row SR1 and the third sub-row SR3 may emit light. Herein, the first lens LS1 is disposed on each of the plurality of first light emitting diodes ED1 in the first sub-row SR1 and the third sub-row SR3 in all of the first to third areas A1 to A3. Therefore, all of the plurality of pixels PX1, PX2 and PX3 in the first to third areas A1 to A3 may display content at the first viewing angle. For example, content may be displayed at the first viewing angle in all of the digital cluster of the first area A1, the center information display (CID) of the second area A2, and the co-driver display (CDD) of the third area A3.

Meanwhile, in the first mode, the plurality of first pixels PX1, the plurality of second pixels PX2, and the plurality of third pixels PX3 disposed in the first row R1 and the second row R2 are supplied with the second selection signal Ps of a turn-off level. Thus, a plurality of second light emitting diodes ED2 disposed in the second sub-row SR2 and the fourth sub-row SR4 may not emit light.

Further, when the display device 100 is driven in the second mode, the mode selector MD may supply the second selection signal Ps to the first and third areas A1 and A3 of the display panel PN and the first selection signal Ss to the second area A2 of the display panel PN. Thus, the first and second areas A1 and A2 may be driven in the share mode and the third area A3 may be driven in the private mode.

For example, referring to FIG. 11B, in the second mode, the second selection signal Ps may be supplied to each of the plurality of first pixels PX1 disposed in the first area A1 and the plurality of third pixels PX3 disposed in the third area A3 through the second selection signal line SSL2. Thus, the plurality of first pixels PX1 and the plurality of third pixels PX3 disposed in the first row R1 and the second row R2 are driven in the second state by the second selection signal Ps. Therefore, the second driving current is generated. Accordingly, a plurality of second light emitting diodes ED2 disposed in the second sub-row SR2 and the fourth sub-row SR4 may emit light. Herein, the first lens LS1 is disposed on each of the plurality of second light emitting diodes ED2 in the second sub-row SR2 and the fourth sub-row SR4 in the first area A1. Therefore, the plurality of first pixels PX1 in the first area A1 may display content at the first viewing angle. Also, the second lens LS2 is disposed on each of the plurality of second light emitting diodes ED2 in the second sub-row SR2 and the fourth sub-row SR4 in the third area A3. Therefore, the plurality of third pixels PX3 in the third area A3 may display content at the second viewing angle.

Meanwhile, in the second mode, the plurality of first pixels PX1 and the plurality of third pixels PX3 disposed in the first row R1 and the second row R2 are supplied with the first selection signal Ss of a turn-off level. Thus, a plurality of first light emitting diodes ED1 disposed in the first sub-row SR1 and the third sub-row SR3 may not emit light.

Also, the plurality of second pixels PX2 disposed in the second area A2 may be driven in the second mode in substantially the same manner as in the first mode. That is, in the second mode, the plurality of second pixels PX2 disposed in the second area A2 is supplied with the first selection signal Ss. Thus, the plurality of second pixels PX2 in the second area A2 may be driven in the first state and the first light emitting diodes ED1 may emit light to display content at the first viewing angle.

Meanwhile, in the second mode, the plurality of second pixels PX2 disposed in the first row R1 and the second row R2 is supplied with the second selection signal Ps of a turn-off level. Thus, a plurality of second light emitting diodes ED2 disposed in the second sub-row SR2 and the fourth sub-row SR4 may not emit light.

Therefore, in the second mode, the first and second pixels PX1 and PX2 in the first and second areas A1 and A2 may display content at the first viewing angle, and the third pixels PX3 in the third area A3 may display content at the second viewing angle. For example, content may be displayed at the first viewing angle in the digital cluster of the first area A1 and the center information display (CID) of the second area A2, and at the second viewing angle in the co-driver display (CDD) of the third area A3.

As such, the first area A1 and the second area A2 may display content at the first viewing angle regardless of a driving mode. Also, the third area A3 may display content at the first viewing angle or the second viewing angle depending on a driving mode. That is, the first mode and the second mode may be driving modes divided for controlling the third area A3 to display content at the first viewing angle, e.g., a wide viewing angle, or at the second viewing angle, e.g., a narrow viewing angle.

When the display device 100 is driven in the first mode and the second mode, the first selection signal Ss or the second selection signal Ps may be supplied to the third pixel PX3 disposed in the third area A3 to control the third area A3 to display content at the first viewing angle or the second viewing angle depending on a driving mode. However, in this case, only the first lens LS1 is disposed in each of the sub-rows SR1 to SR4 in the first area A1. Thus, the first area A1 can be driven in synchronization with the third area A3. Therefore, the display device 100 can be simply driven.

For example, in the first mode according to a driving mode, the first selection signal Ss may be supplied to the third pixel PX3 disposed in the third area A3 to drive the third area A3 in the share mode. In this case, the first selection signal Ss may also be supplied to the first pixel PX1 disposed in the first area A1 to drive the first area A1 in the share mode. As a result, the first area A1 may be driven.

Also, in the second mode according to a driving mode, the second selection signal Ps may be supplied to the third pixel PX3 disposed in the third area A3 to drive the third area A3 in the private mode. In this case, even when the first area A1 is driven in the share mode, the second selection signal Ps may also be supplied to the first pixel PX1 disposed in the first area A1 to drive the first area A1.

As such, in the display device 100 according to an example embodiment of the present disclosure, the first and third pixels PX1 and PX3 disposed in the first and third areas A1 and A3 may be identically driven in the first state or the second state regardless of a driving mode. For example, in the display device 100, only the first selection signal Ss or only the second selection signal Ps may be supplied to the first and third pixels PX1 and PX3 disposed in the first and third areas A1 and A3 to drive the first and third pixels PX1 and PX3 regardless of a driving mode. As such, the first area A1 and the third area A3 are driven in synchronization with each other. Therefore, the display device 100 can be simply driven.

Since the first area A1 and the third area A3 can be driven in synchronization with each other, the first and third pixels PX1 and PX3 disposed in each pixel row of the first and third areas A1 and A3 may be connected to the same selection signal lines SSL1 and SSL2. Therefore, the structure of the display panel PN can be simplified.

Also, in the first mode according to a driving mode, the first light emitting diode ED1 included in each of the plurality of first pixels PX1 disposed in the first area A1 may emit light. Further, in the second mode, the second light emitting diode ED2 included in each of the plurality of first pixels PX1 disposed in the first area A1 may emit light. Thus, only the first light emitting diode ED1 or only the second light emitting diode ED2 in the first area A1 emits light depending on a driving mode. Therefore, the luminous efficiency and lifespan of the first and second light emitting diodes ED1 and ED2 can be improved.

Meanwhile, as described above, the second area A2 displays content at the first viewing angle regardless of a driving mode. Thus, in both of the first mode and the second mode, only the first selection signal Ss may be supplied to the plurality of second pixels PX2 disposed in the second area A2. That is, in both of the first mode and the second mode, only the first light emitting diode ED1 of the plurality of second pixels PX2 disposed in the second area A2 may emit light.

Figure 12:
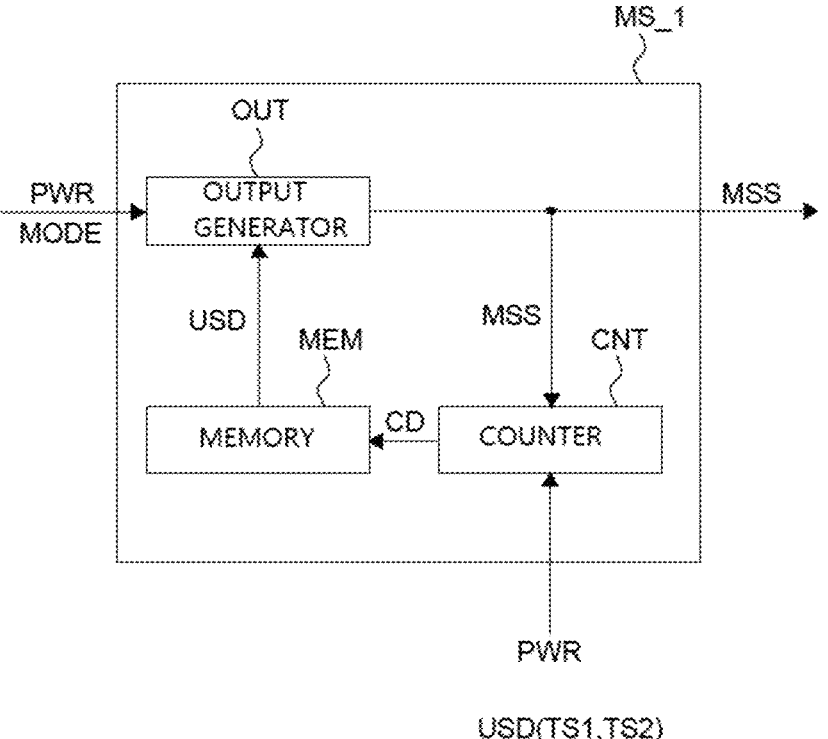
FIG. 12 is a block view illustrating an example of a mode controller included in the display device according to an example embodiment of the present disclosure.
Figure 13:
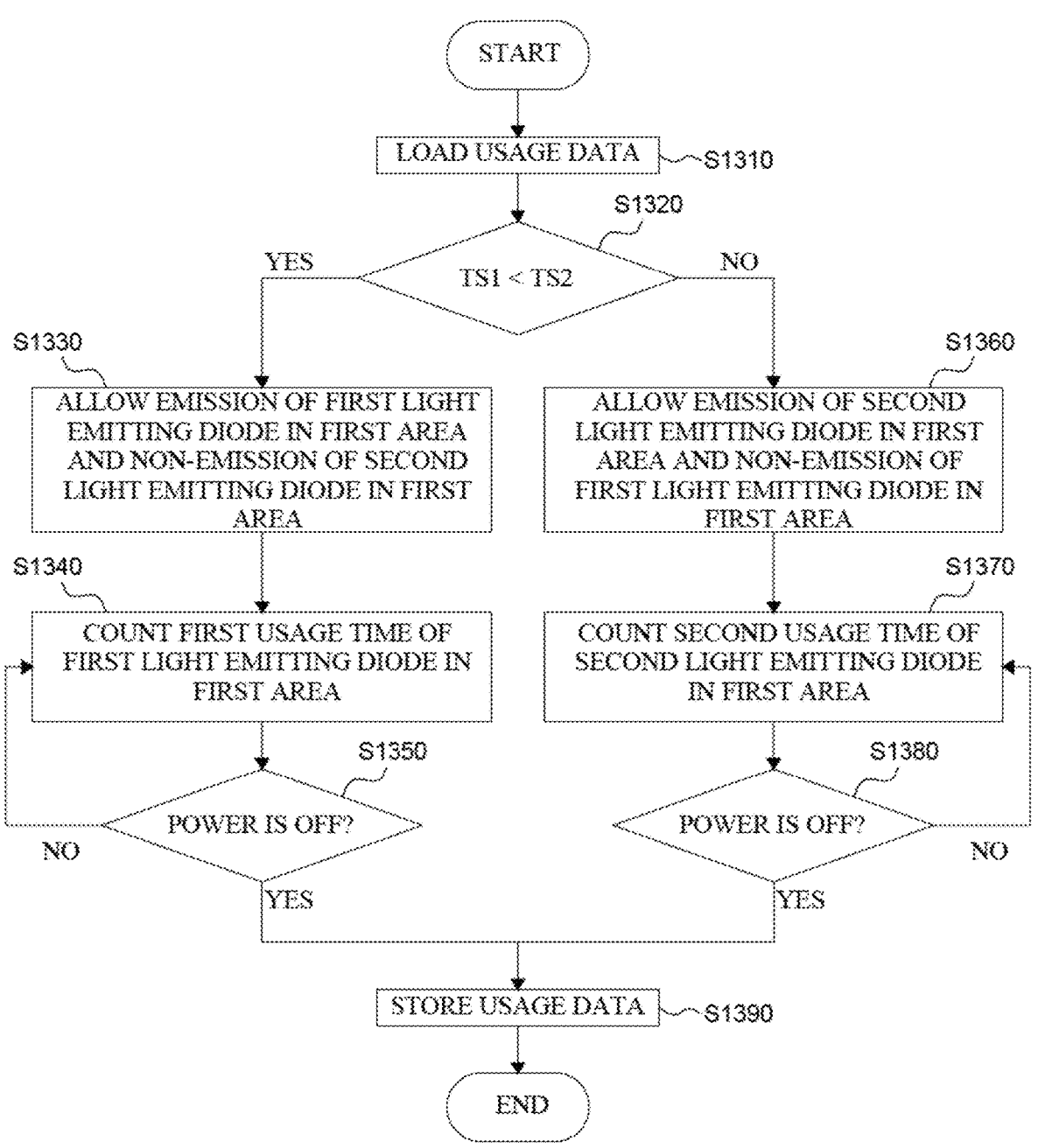
FIG. 13 is a flowchart showing a method of driving the display device according to an example embodiment of the present disclosure.
Figure 14A:
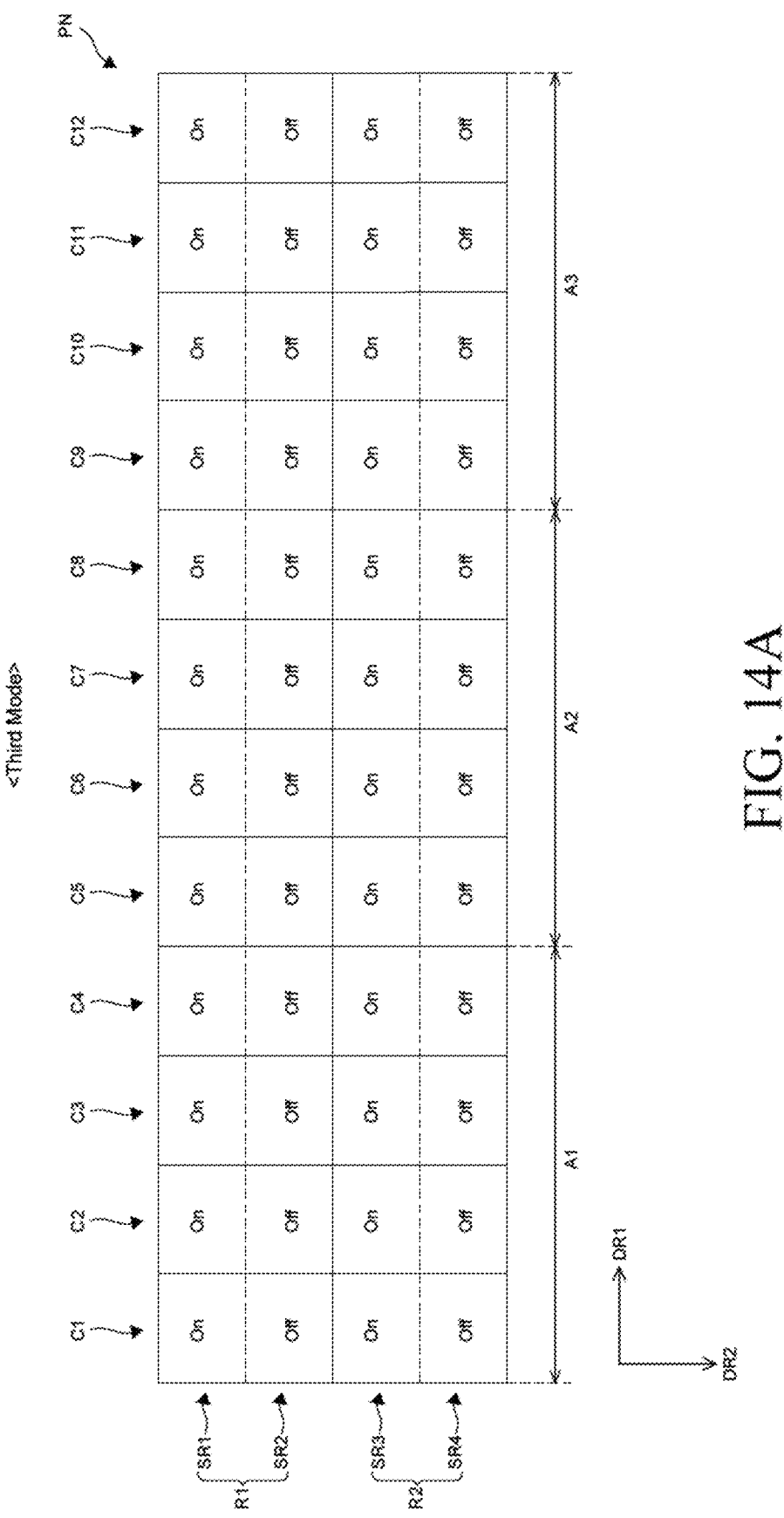
FIG. 14A illustrates an example where the display panel included in the display device according to an example embodiment of the present disclosure is driven in a third mode.
Figure 14B:
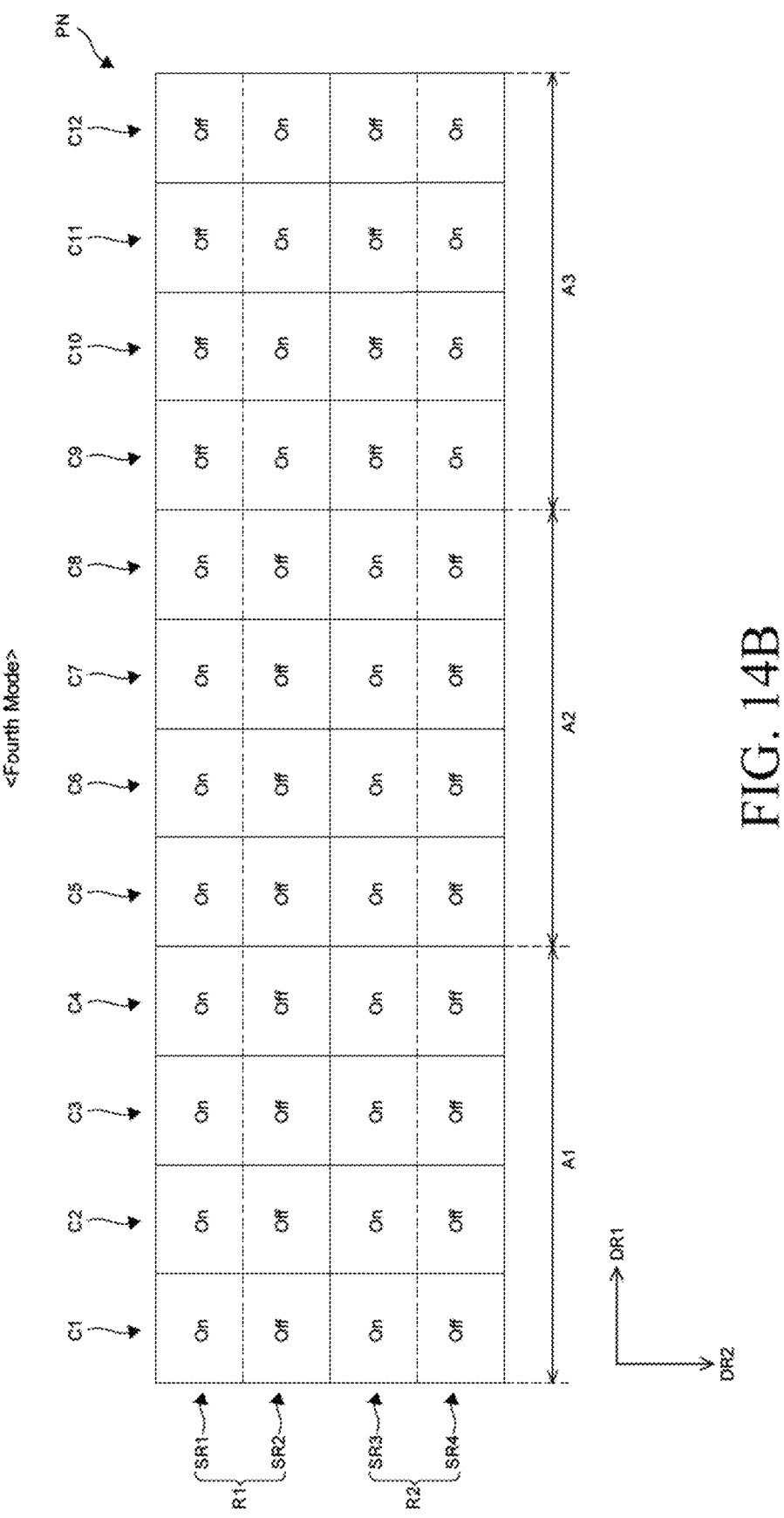
FIG. 14B illustrates an example where the display panel included in the display device according to an example embodiment of the present disclosure is driven in a fourth mode.
Figure 15A:
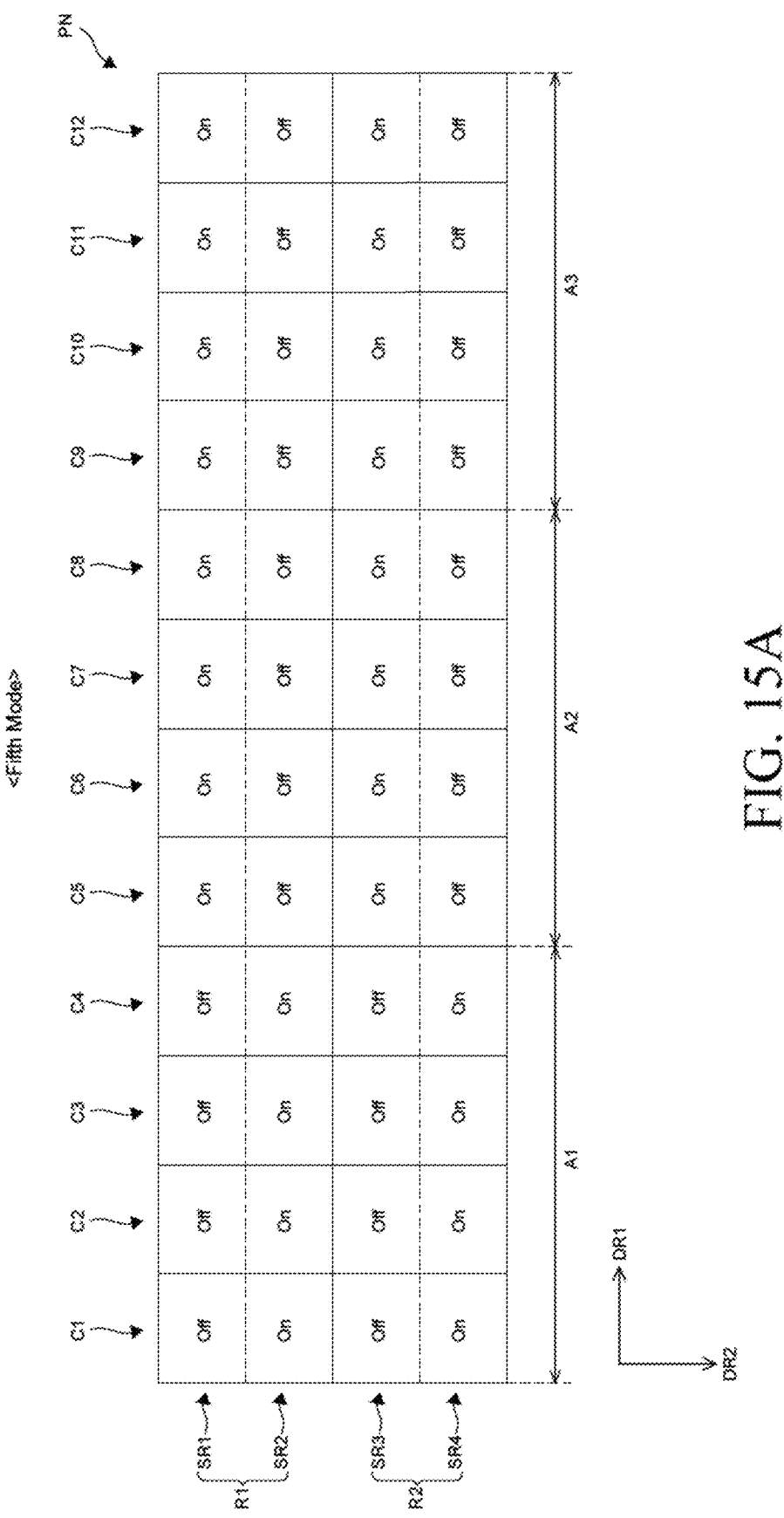
FIG. 15A illustrates an example where the display panel included in the display device according to an example embodiment of the present disclosure is driven in a fifth mode.
Figure 15B:
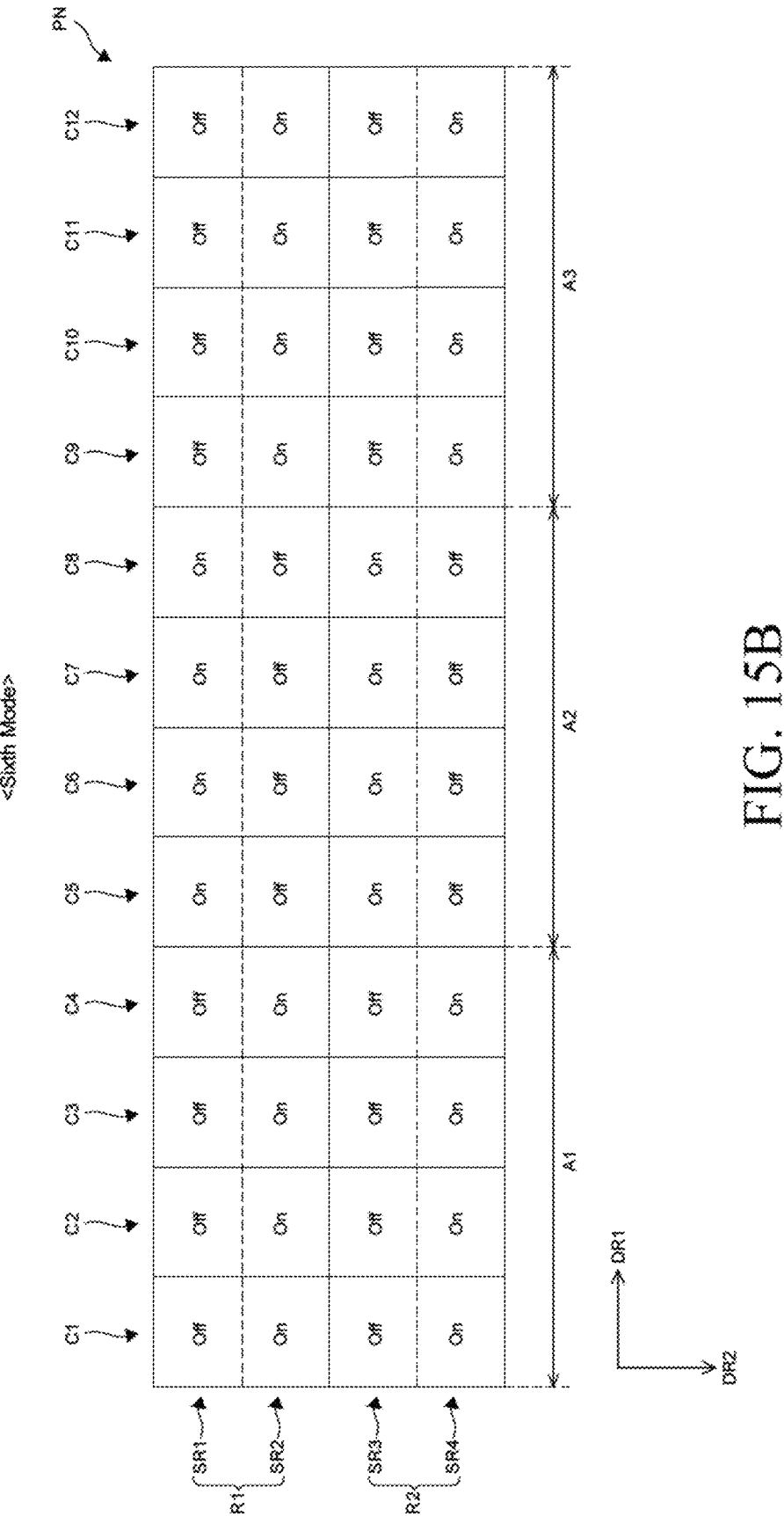
FIG. 15B illustrates an example where the display panel included in the display device according to an example embodiment of the present disclosure is driven in a sixth mode.

FIG. 12 is a block view illustrating an example of a mode controller included in the display device according to an example embodiment of the present disclosure. FIG. 13 is a flowchart showing a method of driving the display device according to an example embodiment of the present disclosure. FIG. 14A illustrates an example where the display panel included in the display device according to an example embodiment of the present disclosure is driven in a third mode. FIG. 14B illustrates an example where the display panel included in the display device according to an example embodiment of the present disclosure is driven in a fourth mode. FIG. 15A illustrates an example where the display panel included in the display device according to an example embodiment of the present disclosure is driven in a fifth mode. FIG. 15B illustrates an example where the display panel included in the display device according to an example embodiment of the present disclosure is driven in a sixth mode.

The method of driving the display device shown in FIG. 13 may be performed by a mode controller MS_1 of FIG. 12. Therefore, an operation of the mode controller MS_1 will be described with further reference to FIG. 13.

Meanwhile, for the convenience of description, FIG. 14A through FIG. 15B illustrate that each of the light emitting diodes disposed in each of the plurality of sub-rows SR1 to SR4 and the plurality of columns C1 to C12 in the first mode and the second mode, respectively, emits light, which is shown as "On". Also, FIG. 14A through FIG. 15B illustrate that each of the light emitting diodes disposed in each of the plurality of sub-rows SR1 to SR4 and the plurality of columns C1 to C12 in the first mode and the second mode, respectively, does not emit light, which is shown as "Off".

Referring to FIG. 2, FIG. 3, FIG. 4, FIG. 7 through FIG. 9B, and FIG. 12, the mode controller MS_1 may generate the mode selection signal MSS based on a power signal PWR and a mode signal MODE input from the outside. For example, the mode controller MS_1 may compare the remaining lifespans of the first and second light emitting diodes ED1 and ED2 included in the plurality of first pixels PX1 disposed in the first area A1 during power-on based on the power signal PWR. Also, the mode controller MS_1 may generate the mode selection signal MSS for controlling only the first light emitting diode ED1 or the second light emitting diode ED2 to emit light during a driving period of the display device 100 depending on the comparison result. Herein, the driving period may refer to a period of time from power-on to power-off.

To this end, the mode controller MS_1 may include a memory MEM, a counter CNT, and an output generator OUT.

The operation of the mode controller MS_1 will be described in more detail with further reference to FIG. 13. The driving method shown in FIG. 13 may include a process S1310 of loading usage data USD and a process S1320 of comparing first usage time data TS1 with second usage time data TS2.

For example, in the process S1310 of loading usage data USD, the output generator OUT of the mode controller MS_1 may load the usage data USD from the memory MEM.

Herein, the usage data USD may include the first usage time data TS1 and the second usage time data TS2. The first usage time data TS1 may include usage time of the first light emitting diode ED1 included in the first pixel PX1 of the first area A1, e.g., emission time of the first light emitting diode ED1. Also, the second usage time data TS2 may include usage time of the second light emitting diode ED2 included in the first pixel PX1 of the first area A1, e.g., emission time of the second light emitting diode ED2. Meanwhile, the usage data USD may be periodically updated or stored based on count data CD from the counter CNT. An operation of the counter CNT will be described below.

Then, in the process S1320 of comparing the first usage time data TS1 with the second usage time data TS2, the output generator OUT may compare the first usage time data TS1 with the second usage time data TS2.

When the second usage time data TS2 is greater than the first usage time data TS1, the driving method shown in FIG. 13 may further include a process S1330 of allowing emission of the first light emitting diode ED1 in the first area A1 and non-emission of the second light emitting diode ED2 in the first area A1. Also, the driving method shown in FIG. 13 may further include a process S1340 of counting a first usage time of the first light emitting diode ED1 in the first area A1.

For example, when the second usage time data TS2 is greater than the first usage time data TS1, in the process S1330 of allowing emission of the first light emitting diode ED1 in the first area A1 and non-emission of the second light emitting diode ED2 in the first area A1, the output generator OUT may output the mode selection signal MSS to control the first light emitting diode ED1 in the first area A1 to emit light and the second light emitting diode ED2 in the first area A1 not to emit light. Specifically, when the second usage time data TS2 is greater than the first usage time data TS1, accumulated usage of the second light emitting diode ED2 included in the first pixel PX1 of the first area A1 is greater than that of the first light emitting diode ED1. This may mean that the remaining lifespan of the first light emitting diode ED1 is longer than that of the second light emitting diode ED2. Therefore, the output generator OUT may output the mode selection signal MSS to control only the first light emitting diode ED1 with a longer remaining lifespan in the first area A1 to emit light.

In this case, the mode selector MD may supply only the first selection signal Ss to the first area A1 of the display panel PN through the first selection signal line SSL1 in response to the mode selection signal MSS regardless of a driving mode during the corresponding driving period. Also, the mode selector MD may supply the second selection signal Ps of a turn-off level through the second selection signal line SSL2. Therefore, the plurality of first pixels PX1 disposed in the first area A1 may be driven in the first state and only the first driving current may be generated regardless of a driving mode during the corresponding driving period. That is, in the plurality of first pixels PX1 disposed in the first area A1, only the first light emitting diode ED1 may emit light, but the second light emitting diode ED2 may not emit light regardless of a driving mode during the corresponding driving period.

Also, in the process S1340 of counting a first usage time of the first light emitting diode ED1 in the first area A1, the counter CNT may count the first usage time of the first light emitting diode ED1 during the corresponding driving time by using the mode selection signal MSS. For example, the counter CNT may count the first usage time by counting 1 for each predetermined time period (e.g., 10 minutes). However, the present disclosure is not limited thereto.

According to the driving method shown in FIG. 13, it is determined whether the display device 100 is power off (S1350). When the display device 100 is not power off, the process S1340 of counting a first usage time of the first light emitting diode ED1 in the first area A1 may be repeatedly performed. When the display device 100 is power off, usage data may be stored (S1390). For example, when it is determined that the display device 100 is power off based on the power signal PWR, the counter CNT may supply the count data CD including the counted first usage time of the first light emitting diode ED1 to the memory MEM. Then, the memory MEM may reflect the count data CD on the existing usage data USD to update the usage data USD. For example, the memory MEM may update the first usage time data TS1 included in the existing usage data USD based on the count data CD including the counted first usage time.

When the first usage time data TS1 is greater than the second usage time data TS2, the driving method shown in FIG. 13 may further include a process S1360 of allowing emission of the second light emitting diode ED2 in the first area A1 and non-emission of the first light emitting diode ED1 in the first area A1. Also, the driving method shown in FIG. 13 may further include a process S1370 of counting a second usage time of the second light emitting diode ED2 in the first area A1.

For example, when the first usage time data TS1 is greater than the second usage time data TS2, in the process S1360 of allowing emission of the second light emitting diode ED2 in the first area A1 and non-emission of the first light emitting diode ED1 in the first area A1, the output generator OUT may output the mode selection signal MSS to control the second light emitting diode ED2 in the first area A1 to emit light and the first light emitting diode ED1 in the first area A1 not to emit light.

In this case, the mode selector MD may supply only the second selection signal Ps to the first area A1 of the display panel PN through the second selection signal line SSL2 in response to the mode selection signal MSS regardless of a driving mode during the corresponding driving period. Also, the mode selector MD may supply the first selection signal Ss of a turn-off level through the first selection signal line SSL1. Therefore, the plurality of first pixels PX1 disposed in the first area A1 may be driven in the second state and only the second driving current may be generated regardless of a driving mode during the corresponding driving period. That is, in the plurality of first pixels PX1 disposed in the first area A1, only the second light emitting diode ED2 may emit light, but the first light emitting diode ED1 may not emit light regardless of a driving mode during the corresponding driving period.

Also, in the process S1370 of counting a second usage time of the second light emitting diode ED2 in the first area A1, the counter CNT may count the second usage time of the second light emitting diode ED2 during the corresponding driving time by using the mode selection signal MSS.

According to the driving method shown in FIG. 13, it is determined whether the display device 100 is power off (S1380). When the display device 100 is not power off, the process S1370 of counting a second usage time of the second light emitting diode ED2 in the first area A1 may be repeatedly performed. When the display device 100 is power off, usage data may be stored (S1390). For example, when it is determined that the display device 100 is power off based on the power signal PWR, the counter CNT may supply the count data CD including the counted second usage time of the second light emitting diode ED2 to the memory MEM. Then, the memory MEM may reflect the count data CD on the existing usage data USD to update the usage data USD. For example, the memory MEM may update the second usage time data TS2 included in the existing usage data USD based on the count data CD including the counted second usage time.

Referring to FIG. 12, the mode controller MS_1 may receive the mode signal MODE, generate the mode selection signal MSS based on the mode signal MODE, and supply the mode selection signal MSS to the mode selector MD.

The mode selector MD may supply the first selection signal Ss through the first selection signal line SSL1 and the second selection signal Ps through the second selection signal line SSL2 in response to the mode selection signal MSS.

Specifically, when the display device 100 is driven in the third mode or the fifth mode, the mode selector MD may drive all of the first to third areas A1, A2 and A3 in the share mode.

Also, when the display device 100 is driven in the fourth mode or the sixth mode, the mode selector MD may drive the first and second areas A1 and A2 in the share mode and drive the third area A3 in the private mode.

Meanwhile, the third mode and the fourth mode may refer to a mode in which only the first light emitting diode ED1 included in the first pixel PX1 of the first area A1 emits light and the second light emitting diode ED2 does not emit light during a driving period of the display device 100 by the above-described operations of the mode controller MS_1 and the mode selector MD. Also, the fifth mode and the sixth mode may refer to a mode in which only the second light emitting diode ED2 included in the first pixel PX1 of the first area A1 emits light and the first light emitting diode ED1 does not emit light during a driving period of the display device 100 by the above-described operations of the mode controller MS_1 and the mode selector MD.

For example, in the third mode and the fourth mode, the mode selector MD may supply only the first selection signal Ss to each of the plurality of first pixels PX1 in the first area A1 through the first selection signal line SSL1 in response to the mode selection signal MSS, and may supply the second selection signal Ps maintained at a turn-off level through the second selection signal line SSL2.

Likewise, in the fifth mode and the sixth mode, the mode selector MD may supply only the second selection signal Ps to each of the plurality of first pixels PX1 in the first area A1 through the second selection signal line SSL2 in response to the mode selection signal MSS, and may supply the first selection signal Ss maintained at a turn-off level through the first selection signal line SSL1.

First, the third mode will be described in more detail with further reference to FIG. 14A. In the third mode, the first selection signal Ss may be supplied to each of the plurality of first pixels PX1 disposed in the first area A1, the plurality of second pixels PX2 disposed in the second area A2, and the plurality of third pixels PX3 disposed in the third area A3 through the first selection signal line SSL1. Thus, the plurality of first pixels PX1, the plurality of second pixels PX2, and the plurality of third pixels PX3 disposed in the first row R1 and the second row R2 are driven in the first state by the first selection signal Ss. Therefore, the first driving current is generated. Accordingly, a plurality of first light emitting diodes ED1 disposed in the first sub-row SR1 and the third sub-row SR3 may emit light. Herein, the first lens LS1 is disposed on each of the corresponding light emitting diodes in the first sub-row SR1 and the third sub-row SR3 in all of the first to third areas A1 to A3. Therefore, all of the pixels PX1, PX2 and PX3 in the first to third areas A1 to A3 may display content at the first viewing angle. For example, content may be displayed at the first viewing angle in all of the digital cluster of the first area A1, the center information display (CID) of the second area A2, and the co-driver display (CDD) of the third area A3.

Meanwhile, in the third mode, the plurality of first pixels PX1, the plurality of second pixels PX2, and the plurality of third pixels PX3 disposed in the first row R1 and the second row R2 are supplied with the second selection signal Ps of a turn-off level. Thus, a plurality of second light emitting diodes ED2 disposed in the second sub-row SR2 and the fourth sub-row SR4 may not emit light.

Then, the fourth mode will be described in more detail with further reference to FIG. 14B. In the fourth mode, the second selection signal Ps may be supplied to each of the plurality of third pixels PX3 disposed in the third area A3 through the second selection signal line SSL2. Thus, the plurality of third pixels PX3 disposed in the first row R1 and the second row R2 is driven in the second state by the second selection signal Ps. Therefore, the second driving current is generated. Accordingly, a plurality of second light emitting diodes ED2 disposed in the second sub-row SR2 and the fourth sub-row SR4 may emit light. Herein, the second lens LS2 is disposed on each of the corresponding light emitting diodes in the second sub-row SR2 and the fourth sub-row SR4 in the third area. Therefore, the plurality of third pixels PX3 in the third area A3 may display content at the second viewing angle.

Meanwhile, in the fourth mode, the plurality of third pixels PX3 disposed in the first row R1 and the second row R2 is supplied with the first selection signal Ss of a turn-off level. Thus, a plurality of first light emitting diodes ED1 disposed in the first sub-row SR1 and the third sub-row SR3 may not emit light.

Also, the plurality of first pixels PX1 disposed in the first area A1 and the plurality of second pixels PX2 disposed in the second area A2 may be driven in the fourth mode in a substantially the same manner as in the third mode. That is, in the fourth mode, each of the first pixels PX1 and the second pixels PX2 disposed in the first area A1 and the second area A2 is supplied with the first selection signal Ss. Thus, the plurality of first pixels PX1 in the first area A1 and the plurality of second pixels PX2 in the second area A2 may be driven in the first state and the first light emitting diodes ED1 may emit light to display content at the first viewing angle.

Meanwhile, in the fourth mode, the plurality of first pixels PX1 and the plurality of second pixels PX2 disposed in the first row R1 and the second row R2 are supplied with the second selection signal Ps of a turn-off level. Thus, a plurality of second light emitting diodes ED2 disposed in the second sub-row SR2 and the fourth sub-row SR4 may not emit light.

Therefore, in the fourth mode, the first and second pixels PX1 and PX2 in the first and second areas A1 and A2 may display content at the first viewing angle, and the third pixels PX3 in the third area A3 may display content at the second viewing angle. For example, content may be displayed at the first viewing angle in the digital cluster of the first area A1 and the center information display (CID) of the second area A2, and at the second viewing angle in the co-driver display (CDD) of the third area A3.

Meanwhile, in the third mode and the fourth mode, as for the first pixels PX1 in the first area A1, only the first light emitting diode ED1 with a longer remaining lifespan emits light during the driving period of the display device 100 based on the remaining lifespans of the first light emitting diode ED1 and the second light emitting diode ED2. Therefore, the first light emitting diode ED1 and the second light emitting diode ED2 may be used at substantially the same ratio. Therefore, it is possible to suppress degradation in image quality caused by a variation between light emitting diodes in the first area A1.

The fifth mode will be described in more detail with reference to FIG. 15A. In the fifth mode, the first selection signal Ss may be supplied to each of the plurality of second pixels PX2 disposed in the second area A2 and the plurality of third pixels PX3 disposed in the third area A3 through the first selection signal line SSL1. Thus, the plurality of second pixels PX2 and the plurality of third pixels PX3 disposed in the first row R1 and the second row R2 are driven in the first state by the first selection signal Ss. Therefore, the first driving current is generated. Accordingly, a plurality of first light emitting diodes ED1 disposed in the first sub-row SR1 and the third sub-row SR3 may emit light.

Further, in the fifth mode, the second selection signal Ps may be supplied to each of the plurality of first pixels PX1 disposed in the first area A1 through the second selection signal line SSL2. Thus, the plurality of first pixels PX1 disposed in the first row R1 and the second row R2 is driven in the second state by the second selection signal Ps. Therefore, the second driving current is generated. Accordingly, a plurality of second light emitting diodes ED2 disposed in the second sub-row SR2 and the fourth sub-row SR4 may emit light.

Herein, the first lens LS1 is disposed on each of the plurality of second light emitting diodes ED2 in the first sub-row SR1 and the third sub-row SR3 in the second and third areas A2 and A3. Also, the first lens LS1 is disposed on each of the plurality of second light emitting diodes ED2 in the second sub-row SR2 and the fourth sub-row SR4 in the first area A1. Therefore, all of the pixels PX1, PX2 and PX3 in the first to third areas A1 to A3 may display content at the first viewing angle. For example, content may be displayed at the first viewing angle in all of the digital cluster of the first area A1, the center information display (CID) of the second area A2, and the co-driver display (CDD) of the third area A3.

Meanwhile, in the fifth mode, the plurality of second pixels PX2 and the plurality of third pixels PX3 disposed in the first row R1 and the second row R2 are supplied with the second selection signal Ps of a turn-off level. Thus, a plurality of second light emitting diodes ED2 disposed in the second sub-row SR2 and the fourth sub-row SR4 may not emit light.

Also, in the fifth mode, the plurality of first pixels PX1 disposed in the first row R1 and the second row R2 is supplied with the first selection signal Ss of a turn-off level. Thus, a plurality of first light emitting diodes ED1 disposed in the first sub-row SR1 and the third sub-row SR3 may not emit light.

The sixth mode will be described in more detail with reference to FIG. 15B. In the sixth mode, the second selection signal Ps may be supplied to each of the plurality of third pixels PX3 disposed in the third area A3 through the second selection signal line SSL2. Thus, the plurality of third pixels PX3 disposed in the first row R1 and the second row R2 is driven in the second state by the second selection signal Ps. Therefore, the second driving current is generated. Accordingly, a plurality of second light emitting diodes ED2 disposed in the second sub-row SR2 and the fourth sub-row SR4 may emit light.

Herein, the second lens LS2 is disposed on each of the plurality of second light emitting diodes ED2 in the second sub-row SR2 and the fourth sub-row SR4 in the third area A3. Therefore, the plurality of third pixels PX3 in the third area A3 may display content at the second viewing angle.

Meanwhile, in the sixth mode, the plurality of third pixels PX3 disposed in the first row R1 and the second row R2 is supplied with the first selection signal Ss of a turn-off level. Thus, a plurality of first light emitting diodes ED1 disposed in the first sub-row SR1 and the third sub-row SR3 may not emit light.

Also, the plurality of first pixels PX1 disposed in the first area A1 and the plurality of second pixels PX2 disposed in the second area A2 may be driven in the sixth mode in a substantially the same manner as in the fifth mode.

That is, in the sixth mode, each of the first pixels PX1 disposed in the first area A1 is supplied with the second selection signal Ps. Thus, the plurality of first pixels PX1 in the first area A1 may be driven in the second state and the second light emitting diodes ED2 may emit light to display content at the first viewing angle.

Meanwhile, in the sixth mode, the plurality of first pixels PX1 disposed in the first row R1 and the second row R2 is supplied with the first selection signal Ss of a turn-off level. Thus, a plurality of first light emitting diodes ED1 disposed in the first sub-row SR1 and the third sub-row SR3 may not emit light.

Also, in the sixth mode, the plurality of second pixels PX2 disposed in the second area A2 is supplied with the first selection signal Ss. Thus, the plurality of second pixels PX2 in the second area A2 may be driven in the first state and the first light emitting diodes ED1 may emit light to display content at the first viewing angle.

Meanwhile, in the fourth mode, the plurality of second pixels PX2 disposed in the first row R1 and the second row R2 is supplied with the second selection signal Ps of a turn-off level. Thus, a plurality of second light emitting diodes ED2 disposed in the second sub-row SR2 and the fourth sub-row SR4 may not emit light.

Therefore, in the sixth mode, the first and second pixels PX1 and PX2 in the first and second areas A1 and A2 may display content at the first viewing angle, and the third pixels PX3 in the third area A3 may display content at the second viewing angle. For example, content may be displayed at the first viewing angle in the digital cluster of the first area A1 and the center information display (CID) of the second area A2, and at the second viewing angle in the co-driver display (CDD) of the third area A3.

Meanwhile, in the fifth mode and the sixth mode, as for the first pixels PX1 in the first area A1, only the second light emitting diode ED2 with a longer remaining lifespan emits light during the driving period of the display device 100 based on the remaining lifespans of the first light emitting diode ED1 and the second light emitting diode ED2. Therefore, the first light emitting diode ED1 and the second light emitting diode ED2 may be used at substantially the same ratio. Therefore, it is possible to suppress degradation in image quality caused by a variation between light emitting diodes in the first area A1.

Figure 16:
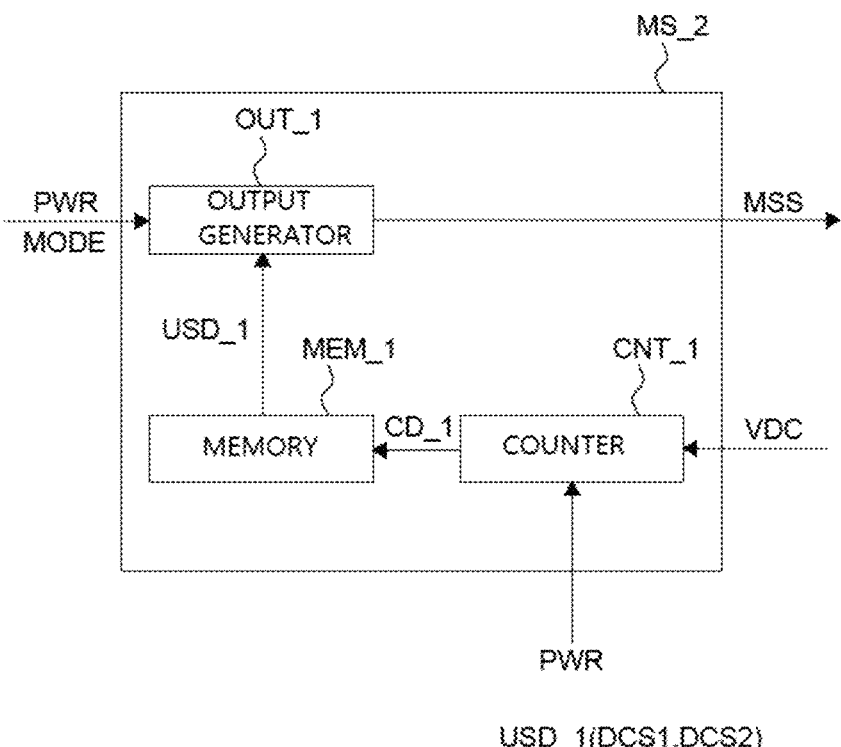
FIG. 16 is a block view illustrating an example of a mode controller included in the display device according to an example embodiment of the present disclosure.
Figure 17:
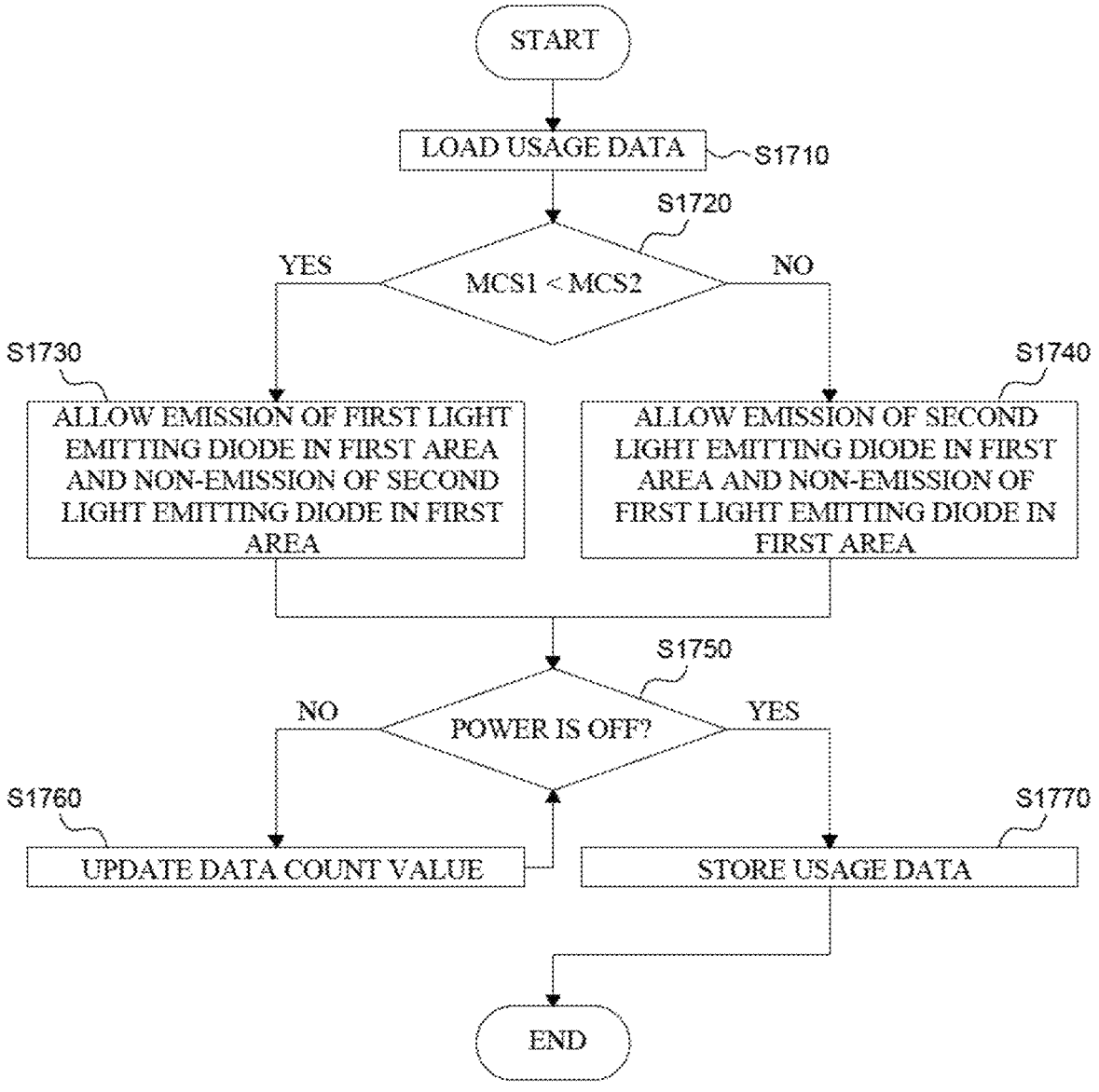
FIG. 17 is a flowchart showing a method of driving the display device according to an example embodiment of the present disclosure.

FIG. 16 is a block view illustrating an example of a mode controller included in the display device according to an example embodiment of the present disclosure. FIG. 17 is a flowchart showing a method of driving the display device according to an example embodiment of the present disclosure.

The method of driving the display device shown in FIG. 17 may be performed by a mode controller MS_2 of FIG. 16. Therefore, an operation of the mode controller MS_2 will be described with further reference to FIG. 17.

The mode controller MS_2 of FIG. 16 is a modification example of the mode controller MS_1 of FIG. 12 in connection with targets to be counted for comparing the remaining lifespans of the first and second light emitting diodes ED1 and ED2 included in the plurality of first pixels PX1 disposed in the first area A1. Therefore, redundant description thereof will be omitted.

Referring to FIG. 2, FIG. 3, FIG. 4, FIG. 7 through FIG. 9B, and FIG. 16, the mode controller MS_2 may generate the mode selection signal MSS based on the power signal PWR and the mode signal MODE input from the outside. For example, the mode controller MS_2 may compare the remaining lifespans of the first and second light emitting diodes ED1 and ED2 included in the plurality of first pixels PX1 disposed in the first area A1 during power-on based on the power signal PWR. Also, the mode controller MS_2 may generate the mode selection signal MSS for controlling only the first light emitting diode ED1 or the second light emitting diode ED2 to emit light during a driving period of the display device 100 depending on the comparison result. Herein, the driving period may refer to a period of time from power-on to power-off.

To this end, the mode controller MS_2 may include a memory MEM_1, a counter CNT_1, and an output generator OUT_1.

The operation of the mode controller MS_2 will be described in more detail with further reference to FIG. 17. The driving method shown in FIG. 17 may include a process S1710 of loading usage data USD_1 and a process S1720 of comparing a first maximum count value MCS1 with a second maximum count value MCS2.

For example, in the process S1710 of loading usage data USD_1, the output generator OUT_1 of the mode controller MS_2 may load the usage data USD_1 from the memory MEM_1.

Herein, the usage data USD_1 may include a first data count value DVC1 and a second data count value DVC2.

The first data count value DVC1 may refer to an accumulation amount of image data values VDC of the first light emitting diode ED1 included in the first pixel PX1 of the first area A1. The first data count value DVC1 may correspond to the accumulation amount of image data values VDC corresponding to an image displayed in the first area A1. Herein, the first data count value DVC1 may be counted for each of the plurality of first pixels PX1 and then stored. That is, first data count value DVC1 may be counted for each of the plurality of first light emitting diodes ED1 included in the plurality of first pixels PX1 and then stored. For example, first data count values DVC1 may be counted based on image data values VDC supplied during a driving period in which the first light emitting diode ED1 included in the first pixel PX1 of the first area A1 emits light, and then, the first data count values DVC1 may be stored.

The second data count value DVC2 may refer to an accumulation amount of image data values VDC of the second light emitting diode ED2 included in the first pixel PX1 of the first area A1. The second data count value DVC2 may correspond to the accumulation amount of image data values VDC corresponding to the image displayed in the first area A1. Herein, the second data count value DVC2 may be counted for each of the plurality of first pixels PX1 and then stored. That is, the second data count value DVC2 may be counted for each of the plurality of second light emitting diodes ED2 included in the plurality of first pixels PX1 and then stored. For example, second data count values DVC2 may be counted based on image data values VDC supplied during a driving period in which the second light emitting diode ED2 included in the first pixel PX1 of the first area A1 emits light. Then, the second data count values DVC2 may be stored.

The image data values VDC may be supplied from the timing controller TD or the data driver DD. However, the present disclosure is not limited thereto.

Meanwhile, the usage data USD_1 may be periodically updated or stored based on a data count value CD_1 from the counter CNT_1. An operation of the counter CNT_1 will be described below.

Then, in the process S1720 of comparing the first maximum count value MCS1 with the second maximum count value MCS2, the output generator OUT_1 may extract the first maximum count value MCS1, which is the maximum value among the first data count values DVC1, and the second maximum count value MCS2, which is the maximum value among the second data count values DVC2. Also, the output generator OUT_1 may compare the first maximum count value MCS1 with the second maximum count value MCS2.

Herein, when the second maximum count value MCS2 is greater than the first maximum count value MCS1, the driving method shown in FIG. 17 may further include a process S1730 of allowing emission of the first light emitting diode ED1 in the first area A1 and non-emission of the second light emitting diode ED2 in the first area A1.

For example, when the second maximum count value MCS2 is greater than the first maximum count value MCS1, in the process S1730 of allowing emission of the first light emitting diode ED1 in the first area A1 and non-emission of the second light emitting diode ED2 in the first area A1, the output generator OUT_1 may output the mode selection signal MSS to control the first light emitting diode ED1 in the first area A1 to emit light and the second light emitting diode ED2 in the first area A1 not to emit light. For example, when the second maximum count value MCS2 is greater than the first maximum count value MCS1, an accumulation amount of luminance of an image displayed by the second light emitting diode ED2 included in the first pixel PX1 of the first area A1 is greater than that of an image displayed by the first light emitting diode ED1. This may mean that the remaining lifespan of the first light emitting diode ED1 is longer than that of the second light emitting diode ED2. Therefore, the output generator OUT_1 may output the mode selection signal MSS to control only the first light emitting diode ED1 with a longer remaining lifespan in the first area A1 to emit light.

In this case, the mode selector MD may supply only the first selection signal Ss to the first area A1 of the display panel PN through the first selection signal line SSL1 in response to the mode selection signal MSS regardless of a driving mode during the corresponding driving period. Also, the mode selector MD may supply the second selection signal Ps of a turn-off level through the second selection signal line SSL2. Therefore, as described above with reference to FIG. 12 through FIG. 14B, in the plurality of first pixels PX1 disposed in the first area A1, only the first light emitting diode ED1 may emit light, but the second light emitting diode ED2 may not emit light regardless of a driving mode during the corresponding driving period.

When the first maximum count value MCS1 is greater than the second maximum count value MCS2, the driving method shown in FIG. 17 may further include a process S1740 of allowing emission of the second light emitting diode ED2 in the first area A1 and non-emission of the first light emitting diode ED1 in the first area A1.

For example, when the first maximum count value MCS1 is greater than the second maximum count value MCS2, in the process S1740 of allowing emission of the second light emitting diode ED2 in the first area A1 and non-emission of the first light emitting diode ED1 in the first area A1, the output generator OUT_1 may output the mode selection signal MSS to control the second light emitting diode ED2 in the first area A1 to emit light and the first light emitting diode ED1 in the first area A1 not to emit light.

In this case, the mode selector MD may supply only the second selection signal Ps to the first area A1 of the display panel PN through the selection signal line SSL2 in response to the mode selection signal MSS regardless of a driving mode during the corresponding driving period. Also, the mode selector MD may supply the first selection signal Ss of a turn-off level through the first selection signal line SSL1. Therefore, as described above with reference to FIG. 12, FIG. 13, FIG. 15A, and FIG. 15B, in the plurality of first pixels PX1 disposed in the first area A1, only the second light emitting diode ED2 may emit light, but the first light emitting diode ED1 may not emit light regardless of a driving mode during the corresponding driving period.

According to the driving method shown in FIG. 17, it is determined whether the display device 100 is power off (S1750). When the display device 100 is not power off, a process S1760 of updating the data count value CD_1 may be repeatedly performed. When the display device 100 is power off, the usage data USD_1 may be stored (S1770). For example, when it is determined that the display device 100 is not power off based on the power signal PWR, the counter CNT_1 may generate data count values CD_1 from the image data values VDC and supply the data count values CD_1 to the memory MEM_1 every predetermined time period. However, when it is determined that the display device 100 is power off based on the power signal PWR, the memory MEM_1 may update the usage data USD_1 based on the data count values CD_1 supplied from the counter CNT_1 during the driving period.

Meanwhile, it has been described above that the mode controller MS_2 compares the first maximum count value MCS1 with the second maximum count value MCS2. However, the present disclosure is not limited thereto. For example, the mode controller MS_2 may compare the sum (or average) of the first data count values DVC1 with the sum (or average) of the second data count values DVC2 and generate the mode selection signal MSS based on the comparison result.

Also, it has been described above that the mode controller MS_2 generates the data count value CD_1 based on the image data values VDC corresponding to an image displayed in the entire first area A1. However, the present disclosure is not limited thereto. For example, the mode controller MS_2 may generate the data count value CD_1 based on the image data values VDC corresponding to an image displayed in at least part of the first area A1 adjacent to the second area A2. For example, the at least part of the first area A1 adjacent to the second area A2 may be set to a region where the plurality of first pixels PX1 in the fourth column C4 is disposed as described above with reference to FIG. 9A. However, this is merely an example. The at least part of the first area A1 adjacent to the second area A2 may be variously designed.

Referring to FIG. 16, the mode controller MS_2 may receive the mode signal MODE, generate the mode selection signal MSS based on the mode signal MODE, and supply the mode selection signal MSS to the mode selector MD.

The mode selector MD may supply the first selection signal Ss through the first selection signal line SSL1 and the second selection signal Ps through the second selection signal line SSL2 in response to the mode selection signal MSS.

Specifically, when the display device 100 is driven in the third mode or the fifth mode, the mode selector MD may drive all of the first to third areas A1, A2 and A3 in the share mode.

Also, when the display device 100 is driven in the fourth mode or the sixth mode, the mode selector MD may drive the first and second areas A1 and A2 in the share mode and drive the third area A3 in the private mode.

Meanwhile, referring to FIG. 16 and FIG. 17, the display device 100 is driven in the third mode to the sixth mode substantially the same manner as described above with reference to FIG. 12 through FIG. 15B. Therefore, redundant description thereof will be omitted.

Figure 18:
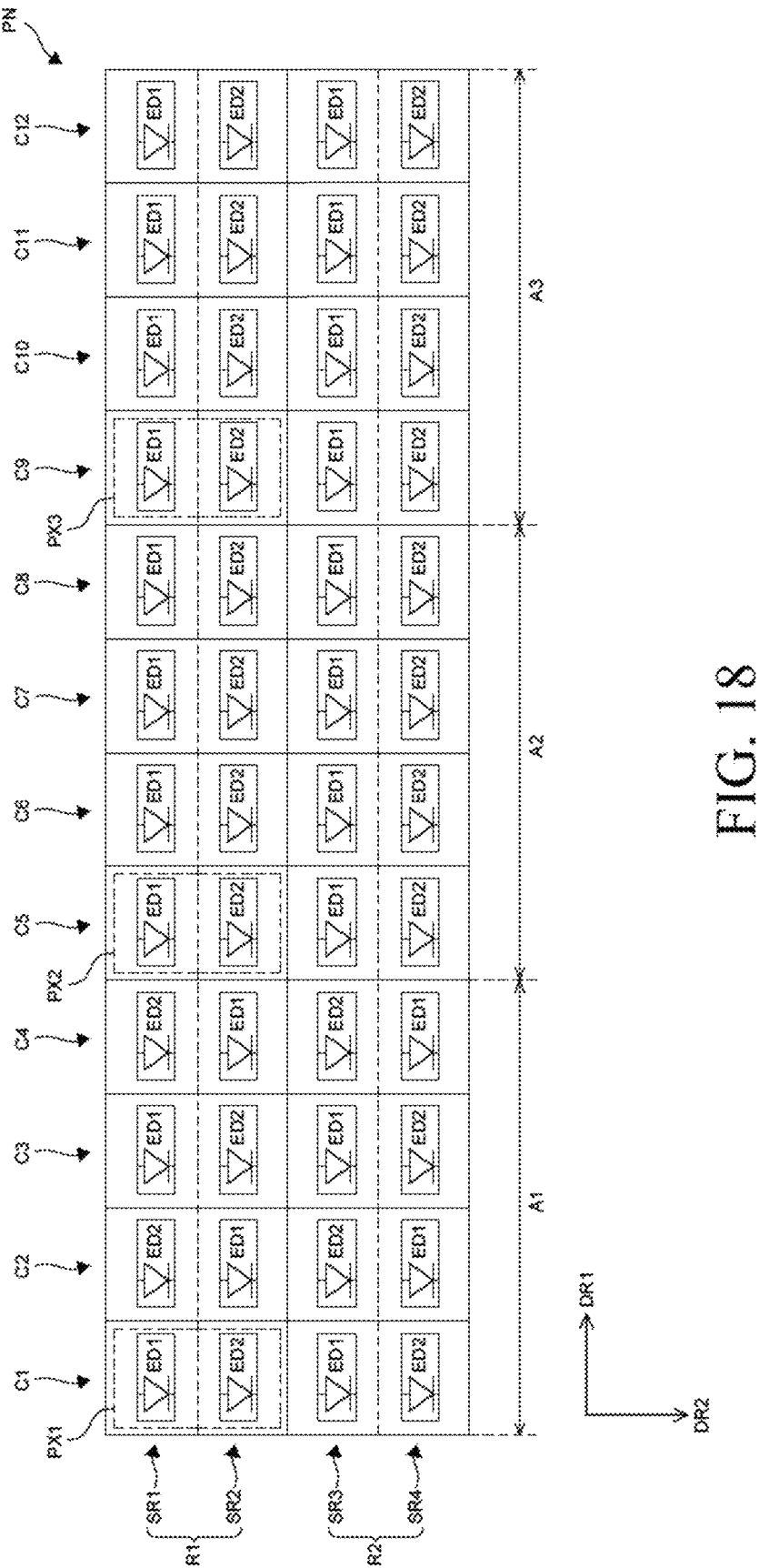
FIG. 18 illustrates an example of a display panel included in the display device according to an example embodiment of the present disclosure.

FIG. 18 illustrates an example of a display panel included in the display device according to an example embodiment of the present disclosure.

A display panel PN_1 of FIG. 18 is a modification example of the display panel PN of FIG. 9A in connection with the relative relationship of positions of the first and second light emitting diodes ED1 and ED2 included in the first pixel PX1 of the first area A1. Therefore, redundant description thereof will be omitted.

Referring to FIG. 18, the display panel PN_1 may include the first area A1, the second area A2, and the third area A3.

Each of the areas A1, A2 and A3 included in the display panel PN_1 may include a plurality of pixels PX_1 including a plurality of pixel circuits, respectively. For example, the first area A1 of the display panel PN_1 may include the plurality of first pixels PX1, the second area A2 of the display panel PN_1 may include the plurality of second pixels PX2, and the third area A3 of the display panel PN_1 may include the plurality of third pixels PX3.

Each of the plurality of first pixels PX1 disposed in the first area A1 may include the first light emitting diode ED1 and the second light emitting diode ED2.

A plurality of first light emitting diodes ED1 and a plurality of second light emitting diodes ED2 included in the plurality of first pixels PX1 may be alternately disposed along each of the first direction DR1 and the second direction DR2 in the first area A1.

For example, the first light emitting diode ED1 and the second light emitting diode ED2 may be alternately disposed along the first direction DR1 in each of the first to fourth sub-rows SR1 to SR4 in the first area A1. Also, the first light emitting diode ED1 and the second light emitting diode ED2 may be alternately disposed along the second direction DR2 in each of the first to fourth columns C1 to C4 in the first area A1. Thus, the first light emitting diode ED1 and the second light emitting diode ED2 included in the plurality of first pixels PX1 of the first area A1 may be alternately disposed along each of the first direction DR1 and the second direction DR2 so as not to be adjacent to each other.

As described above with reference to FIG. 10 and FIG. 11A, when the display panel PN_1 is driven in the first mode, the first selection signal Ss is supplied to each of the plurality of first pixels PX1 of the first area A1. Thus, the first driving current is generated. Therefore, the plurality of first light emitting diodes ED1 disposed in the first area A1 of the display panel PN_1 may emit light. Also, the second selection signal Ps of a turn-off level is supplied to each of the plurality of first pixels PX1 of the first area A1. Thus, the plurality of second light emitting diodes ED2 disposed in the first area A1 of the display panel PN_1 may not emit light.

Likewise, as described above with reference to FIG. 10 and FIG. 11B, when the display panel PN_1 is driven in the second mode, the first selection signal Ss is supplied to each of the plurality of second pixels PX2 of the first area A1. Thus, the second driving current is generated. Therefore, the plurality of second light emitting diodes ED2 disposed in the first area A1 of the display panel PN_1 may emit light. Also, the first selection signal Ss of a turn-off level is supplied to each of the plurality of first pixels PX1 of the first area A1. Thus, the plurality of first light emitting diodes ED1 disposed in the first area A1 of the display panel PN_1 may not emit light.

As such, in the structure of the display panel PN_1 shown in FIG. 18, the first light emitting diode ED1 and the second light emitting diode ED2 included in the plurality of first pixels PX1 of the first area A1 are alternately disposed along each of the first direction DR1 and the second direction DR2 so as not to be adjacent to each other. In the first mode, the plurality of first light emitting diodes ED1 which is not adjacent to each other in the first area A1 may emit light. Also, in the second mode, the plurality of second light emitting diodes ED2 which is not adjacent to each other in the first area A1 may emit light. Therefore, it is possible to improve visibility of a boundary between images displayed in the first area A1.

Various examples and aspects of the present disclosure are described below. These are provided as examples, and do not limit the scope of the present disclosure.

According to one or more example embodiments of the present disclosure, there is provided a display device. The display device comprises: a display panel divided into a first area, a second area adjacent to the first area in a first direction, and a third area adjacent to the second area in the first direction, and including a plurality of first light emitting diodes, a plurality of second light emitting diodes, a plurality of first optical members, and a plurality of second optical members; a mode controller configured to generate a mode selection signal corresponding to a driving mode of the display panel; and a mode selector configured to generate a selection signal based on the mode selection signal, and to supply the selection signal to the display panel, wherein the plurality of first light emitting diodes, the plurality of second light emitting diodes, and the plurality of first optical members are disposed in each of the first area, the second area, and the third area, and the plurality of second optical members is disposed in each of the second area and the third area, and at least some of the plurality of first optical members in the first area are disposed in a same row as the plurality of second optical members in the second area and the third area.

In the first area, the plurality of first light emitting diodes and the plurality of first optical members may be disposed in a first sub-row of the display panel, and the plurality of second light emitting diodes and the plurality of first optical members are disposed in a second sub-row adjacent to the first sub-row in a second direction different from the first direction.

In each of the second area and the third area, the plurality of first light emitting diodes and the plurality of first optical members may be disposed in the first sub-row, and the plurality of second light emitting diodes and the plurality of second optical members are disposed in the second sub-row.

In a first mode, each of the plurality of first light emitting diodes disposed in the first sub-row may be configured to emit light, and each of the plurality of second light emitting diodes disposed in the second sub-row may be configured not to emit light.

In a second mode different from the first mode, first light emitting diodes disposed in the second area among the plurality of first light emitting diodes disposed in the first sub-row may be configured to emit light, and first light emitting diodes disposed in the first area and the third area among the plurality of first light emitting diodes disposed in the first sub-row may be configured not to emit light, and second light emitting diodes disposed in the second area among the plurality of second light emitting diodes disposed in the second sub-row may be configured not to emit light, and second light emitting diodes disposed in the first area and the third area among the plurality of second light emitting diodes disposed in the second sub-row may be configured to emit light.

In a third mode, each of the plurality of first light emitting diodes disposed in the first sub-row may be configured to emit light, and each of the plurality of second light emitting diodes disposed in the second sub-row may be configured not to emit light.

In a fourth mode different from the third mode, first light emitting diodes disposed in the first area and the second area among the plurality of first light emitting diodes disposed in the first sub-row may be configured to emit light, and first light emitting diodes disposed in the third area among the plurality of first light emitting diodes disposed in the first sub-row may be configured not to emit light, and second light emitting diodes disposed in the first area and the second area among the plurality of second light emitting diodes disposed in the second sub-row may be configured not to emit light, and second light emitting diodes disposed in the third area among the plurality of second light emitting diodes disposed in the second sub-row may be configured to emit light.

In a fifth mode, first light emitting diodes disposed in the second area and the third area among the plurality of first light emitting diodes disposed in the first sub-row may be configured to emit light, and first light emitting diodes disposed in the first area among the plurality of first light emitting diodes disposed in the first sub-row may be configured not to emit light, and second light emitting diodes disposed in the first area among the plurality of second light emitting diodes disposed in the second sub-row may be configured to emit light, and second light emitting diodes disposed in the second area and the third area among the plurality of second light emitting diodes disposed in the second sub-row may be configured not to emit light.

In sixth mode different from the fifth mode, first light emitting diodes disposed in the second area among the plurality of first light emitting diodes disposed in the first sub-row may be configured to emit light, and first light emitting diodes disposed in the first area and the third area among the plurality of first light emitting diodes disposed in the first sub-row may be configured not to emit light, and second light emitting diodes disposed in the first area and the third area among the plurality of second light emitting diodes disposed in the second sub-row may be configured to emit light, and second light emitting diodes disposed in the second area among the plurality of second light emitting diodes disposed in the second sub-row may be configured not to emit light.

The mode controller may include a memory configured to store usage data including first usage time data of the plurality of first light emitting diodes disposed in the first area and second usage time data of the plurality of second light emitting diodes disposed in the first area, and an output generator configured to compare the first usage time data with the second usage time data based on the usage data, and to generate the mode selection signal based on a result of the comparison.

When the first usage time data may be greater than the second usage time data, in response to the mode selection signal, the plurality of first light emitting diodes disposed in the first area may be configured not to emit light, and the plurality of second light emitting diodes disposed in the first area may be configured to emit light, and when the second usage time data is greater than the first usage time data, in response to the mode selection signal, the plurality of first light emitting diodes disposed in the first area may be configured to emit light, and the plurality of second light emitting diodes disposed in the first area may be configured not to emit light.

The mode controller further may include a counter configured to count a first usage time of the plurality of first light emitting diodes disposed in the first area or a second usage time of the plurality of second light emitting diodes disposed in the first area during a period of time from power-on to power-off, and to generate count data.

The mode controller may include a memory configured to store usage data including a plurality of first data count values corresponding to an accumulation amount of image data values of each of the plurality of first light emitting diodes disposed in the first area and a plurality of second data count values corresponding to an accumulation amount of image data values of each of the plurality of second light emitting diodes disposed in the first area, and an output generator configured to compare a maximum value among the plurality of first data count values based on the usage data with a maximum value among the plurality of second data count values, and to generate the mode selection signal based on a result of the comparison.

When the maximum value among the plurality of first data count values is greater than the maximum value among the plurality of second data count values, in response to the mode selection signal, the plurality of first light emitting diodes disposed in the first area may be configured not to emit light, and the plurality of second light emitting diodes disposed in the first area may be configured to emit light, and when the maximum value among the plurality of second data count values is greater than the maximum value among the plurality of first data count values, in response to the mode selection signal, the plurality of first light emitting diodes disposed in the first area may be configured to emit light, and the plurality of second light emitting diodes disposed in the first area may be configured not to emit light.

The mode controller may further include a counter configured to count the accumulation amount of image data values of each of the plurality of first light emitting diodes disposed in the first area or the accumulation amount of image data values of each of the plurality of second light emitting diodes disposed in the first area during a period of time from power-on to power-off, and to generate count data.

Each of the plurality of first light emitting diodes may be configured to emit light of a same color as each of the plurality of second light emitting diodes, and each of the plurality of first optical members may have a different shape from each of the plurality of second optical members.

Each of the plurality of first optical members may have a viewing angle of a first value, and each of the plurality of second optical members may have a viewing angle of a second value lower than the viewing angle of the first value.

According to one or more example embodiments of the present disclosure, a display device comprises a display panel divided into a first area, a second area adjacent to the first area in a first direction, and a third area adjacent to the second area in the first direction, and including a plurality of first light emitting diodes, a plurality of second light emitting diodes, a plurality of first optical members, and a plurality of second optical members, wherein the plurality of first light emitting diodes, the plurality of second light emitting diodes, and the plurality of first optical members are disposed in each of the first area, the second area, and the third area, and the plurality of second optical members is disposed in each of the second area and the third area, and the plurality of first light emitting diodes and the plurality of second light emitting diodes are alternately disposed in the first area along each of the first direction and a second direction different from the first direction, and at least some of the plurality of first optical members in the first area are disposed in a same row as the plurality of second optical members in the second area and the third area.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure. The scope of protection of the present disclosure should be construed based on the following claims, and all technical features within the scope of equivalents thereof should be construed as being included within the scope of the present disclosure.

What is claimed is:

1. A display device, comprising:
   a display panel divided into a first area, a second area adjacent to the first area in a first direction, and a third area adjacent to the second area in the first direction, and including a plurality of first light emitting diodes, a plurality of second light emitting diodes, a plurality of first optical members, and a plurality of second optical members; and a mode controller configured to generate a mode selection signal corresponding to a driving mode of the display panel, wherein the driving mode of the display panel includes a share mode and a private mode, wherein the plurality of first light emitting diodes and the plurality of second light emitting diodes are configured to emit or not emit light based on the mode selection signal, wherein the plurality of first light emitting diodes, the plurality of second light emitting diodes, and the plurality of first optical members are disposed in each of the first area, the second area, and the third area, the plurality of second optical members is disposed in each of the second area and the third area, at least some of the plurality of first optical members in the first area are disposed in a same row as the plurality of second optical members in the second area and the third area, and wherein the mode controller includes:

a memory configured to store usage data including first usage time data of the plurality of first light emitting diodes disposed in the first area and second usage time data of the plurality of second light emitting diodes disposed in the first area; and an output generator configured to compare the first usage time data with the second usage time data based on the usage data, and to generate the mode selection signal based on a result of the comparison.

2. The display device according to claim 1, wherein in the first area, the plurality of first light emitting diodes and the plurality of first optical members are disposed in a first sub-row of the display panel, and the plurality of second light emitting diodes and the plurality of first optical members are disposed in a second sub-row adjacent to the first sub-row in a second direction different from the first direction.

3. The display device according to claim 2, wherein in each of the second area and the third area, the plurality of first light emitting diodes and the plurality of first optical members are disposed in the first sub-row, and the plurality of second light emitting diodes and the plurality of second optical members are disposed in the second sub-row.

4. The display device according to claim 3, wherein in the share mode, each of the plurality of first light emitting diodes disposed in the first sub-row is configured to emit light, and each of the plurality of second light emitting diodes disposed in the second sub-row is configured not to emit light.

5. The display device according to claim 4, wherein in the private mode different from the share mode, first light emitting diodes disposed in the second area among the plurality of first light emitting diodes disposed in the first sub-row are configured to emit light, and first light emitting diodes disposed in the first area and the third area among the plurality of first light emitting diodes disposed in the first sub-row are configured not to emit light, and second light emitting diodes disposed in the second area among the plurality of second light emitting diodes disposed in the second sub-row are configured not to emit light, and second light emitting diodes disposed in the first area and the third area among the plurality of second light emitting diodes disposed in the second sub-row are configured to emit light.

6. The display device according to claim 4, wherein in the private mode different from the share mode, first light emitting diodes disposed in the first area and the second area among the plurality of first light emitting diodes disposed in the first sub-row are configured to emit light, and first light emitting diodes disposed in the third area among the plurality of first light emitting diodes disposed in the first sub-row are configured not to emit light, and second light emitting diodes disposed in the first area and the second area among the plurality of second light emitting diodes disposed in the second sub-row are configured not to emit light, and second light emitting diodes disposed in the third area among the plurality of second light emitting diodes disposed in the second sub-row are configured to emit light.

7. The display device according to claim 3, wherein in the share mode, first light emitting diodes disposed in the second area and the third area among the plurality of first light emitting diodes disposed in the first sub-row are configured to emit light, and first light emitting diodes disposed in the first area among the plurality of first light emitting diodes disposed in the first sub-row are configured not to emit light, and second light emitting diodes disposed in the first area among the plurality of second light emitting diodes disposed in the second sub-row are configured to emit light, and second light emitting diodes disposed in the second area and the third area among the plurality of second light emitting diodes disposed in the second sub-row are configured not to emit light.

8. The display device according to claim 7, wherein in the private mode different from the share mode, first light emitting diodes disposed in the second area among the plurality of first light emitting diodes disposed in the first sub-row are configured to emit light, and first light emitting diodes disposed in the first area and the third area among the plurality of first light emitting diodes disposed in the first sub-row are configured not to emit light, and second light emitting diodes disposed in the first area and the third area among the plurality of second light emitting diodes disposed in the second sub-row are configured to emit light, and second light emitting diodes disposed in the second area among the plurality of second light emitting diodes disposed in the second sub-row are configured not to emit light.

9. The display device according to claim 1, wherein when the first usage time data is greater than the second usage time data, in response to the mode selection signal, the plurality of first light emitting diodes disposed in the first area is configured not to emit light, and the plurality of second light emitting diodes disposed in the first area is configured to emit light, and when the second usage time data is greater than the first usage time data, light in response to the mode selection signal, the plurality of first light emitting diodes disposed in the first area is configured to emit light, and the plurality of second light emitting diodes disposed in the first area is configured not to emit light.

10. The display device according to claim 1, wherein the mode controller further includes:

a counter configured to count a first usage time of the plurality of first light emitting diodes disposed in the first area or a second usage time of the plurality of second light emitting diodes disposed in the first area during a period of time from power-on to power-off, and to generate count data.

11. The display device according to claim 1, wherein each of the plurality of first light emitting diodes is configured to emit light of a same color as each of the plurality of second light emitting diodes, and each of the plurality of first optical members has a different shape than each of the plurality of second optical members.

12. The display device according to claim 1, wherein each of the plurality of first optical members has a viewing angle of a first value, and each of the plurality of second optical members has a viewing angle of a second value lower than the viewing angle of the first value.

13. The display device according to claim 1, wherein the plurality of first light emitting diodes and the plurality of second light emitting diodes are alternately disposed in the first area along each of the first direction and a second direction different from the first direction.

14. The display device according to claim 1, wherein each of the plurality of first optical members has a shape corresponding to an emission area of each of the plurality of first light emitting diodes, and wherein each of the plurality of second optical members has a shape corresponding to an emission area of each of the plurality of second light emitting diodes.

15. The display device according to claim 1, wherein each of the plurality of first optical members has a bar shape extending in one direction in a plan view.

16. The display device according to claim 1, wherein each of the plurality of second optical members has a circular shape in a plan view.

17. A display device, comprising:

a display panel divided into a first area, a second area adjacent to the first area in a first direction, and a third area adjacent to the second area in the first direction, and including a plurality of first light emitting diodes, a plurality of second light emitting diodes, a plurality of first optical members, and a plurality of second optical members; and a mode controller configured to generate a mode selection signal corresponding to a driving mode of the display panel, wherein the plurality of first light emitting diodes and the plurality of second light emitting diodes are configured to emit or not emit light based on the mode selection signal, wherein the plurality of first light emitting diodes, the plurality of second light emitting diodes, and the plurality of first optical members are disposed in each of the first area, the second area, and the third area, the plurality of second optical members is disposed in each of the second area and the third area, at least some of the plurality of first optical members in the first area are disposed in a same row as the plurality of second optical members in the second area and the third area, and wherein the mode controller includes:

a memory configured to store usage data including a plurality of first data count values corresponding to an accumulation amount of image data values of each of the plurality of first light emitting diodes disposed in the first area and a plurality of second data count values corresponding to an accumulation amount of image data values of each of the plurality of second light emitting diodes disposed in the first area; and an output generator configured to compare a maximum value among the plurality of first data count values based on the usage data with a maximum value among the plurality of second data count values, and to generate the mode selection signal based on a result of the comparison.

18. The display device according to claim 17, wherein when the maximum value among the plurality of first data count values is greater than the maximum value among the plurality of second data count values, in response to the mode selection signal, the plurality of first light emitting diodes disposed in the first area is configured not to emit light, and the plurality of second light emitting diodes disposed in the first area is configured to emit light, and when the maximum value among the plurality of second data count values is greater than the maximum value among the plurality of first data count values, in response to the mode selection signal, the plurality of first light emitting diodes disposed in the first area is configured to emit light, and the plurality of second light emitting diodes disposed in the first area is configured not to emit light.

19. The display device according to claim 17, wherein the mode controller further includes:

a counter configured to count the accumulation amount of image data values of each of the plurality of first light emitting diodes disposed in the first area or the accumulation amount of image data values of each of the plurality of second light emitting diodes disposed in the first area during a period of time from power-on to power-off, and to generate count data.

* * * * *